United States Patent
Yamamoto et al.

(10) Patent No.: US 9,520,164 B1
(45) Date of Patent: Dec. 13, 2016

(54) ZQ CALIBRATION CIRCUIT AND SEMICONDUCTOR DEVICE INCLUDING THE SAME

(71) Applicant: KABUSHIKI KAISHA TOSHIBA, Minato-ku, Tokyo (JP)

(72) Inventors: Kensuke Yamamoto, Kanagawa (JP); Kosuke Yanagidaira, Kanagawa (JP); Shouichi Ozaki, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/947,955

(22) Filed: Nov. 20, 2015

Related U.S. Application Data

(60) Provisional application No. 62/214,517, filed on Sep. 4, 2015.

(51) Int. Cl.
  H03K 17/16 (2006.01)
  G11C 7/00 (2006.01)
  G11C 7/10 (2006.01)
  H03K 3/353 (2006.01)

(52) U.S. Cl.
  CPC .............. *G11C 7/1057* (2013.01); *H03K 3/353* (2013.01)

(58) Field of Classification Search
  CPC ............................ G11C 7/1057; H03K 3/353
  USPC ............................................. 326/30; 365/201
  See application file for complete search history.

(56) References Cited

U.S. PATENT DOCUMENTS

| | | | | |
|---|---|---|---|---|
| 7,477,083 B2* | 1/2009 | Fujisawa | ............. | G11C 7/1051 327/147 |
| 7,528,626 B2* | 5/2009 | Kim | .................. | H03K 19/0005 326/30 |
| 7,839,159 B2* | 11/2010 | Nakamura | ........... | G11C 7/1051 324/755.07 |
| 7,872,493 B2* | 1/2011 | Kuwahara | ............ | G11C 7/1078 326/21 |
| 9,043,539 B2* | 5/2015 | Kaiwa | ...................... | G11C 7/04 365/211 |
| 2005/0068815 A1 | 3/2005 | Garni et al. | | |
| 2011/0090015 A1 | 4/2011 | Sumita et al. | | |
| 2012/0248440 A1 | 10/2012 | Hirohata et al. | | |

FOREIGN PATENT DOCUMENTS

| | | |
|---|---|---|
| JP | 2007507054 A | 3/2007 |
| JP | 2010087275 A | 4/2010 |
| JP | 2012204705 A | 10/2012 |

* cited by examiner

*Primary Examiner* — Kenneth B Wells
(74) *Attorney, Agent, or Firm* — Holtz, Holtz & Volek PC

(57) ABSTRACT

According to one embodiment, a ZQ calibration circuit comprises a replica buffer controller configured to apply electric stress to a replica buffer circuit with a circuit configuration substantially identical to a circuit configuration of an output buffer circuit according to a usage status of the output buffer circuit during a period when no calibration operation is performed.

16 Claims, 21 Drawing Sheets

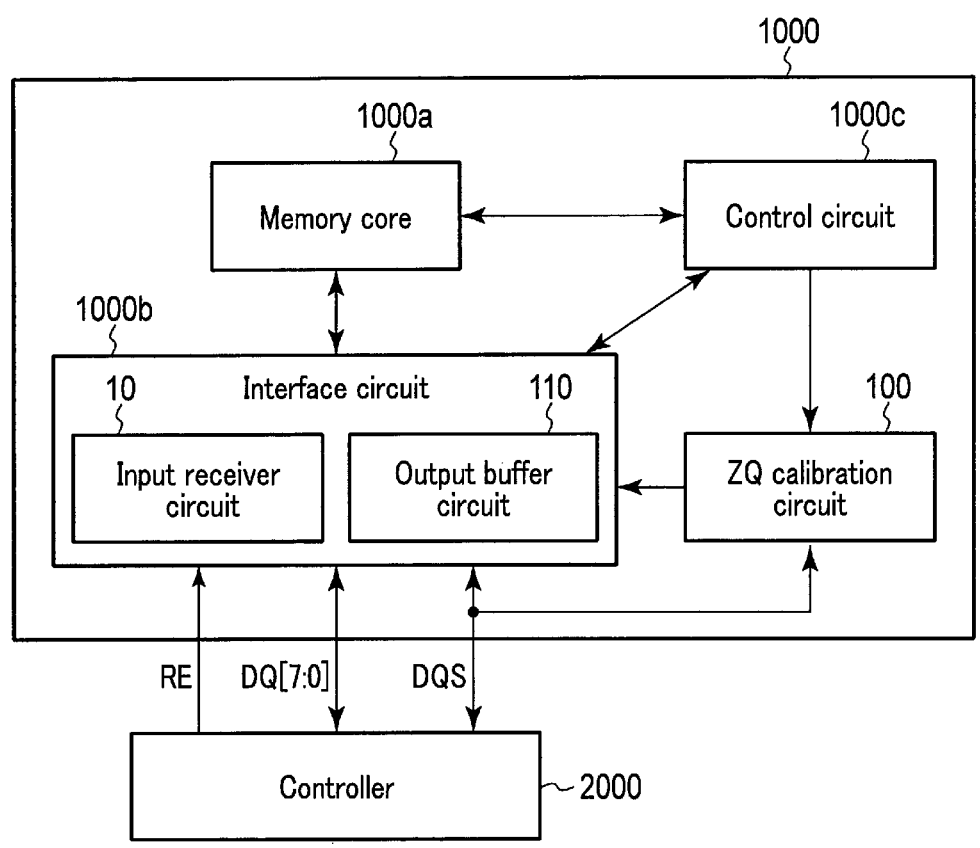
F I G. 1

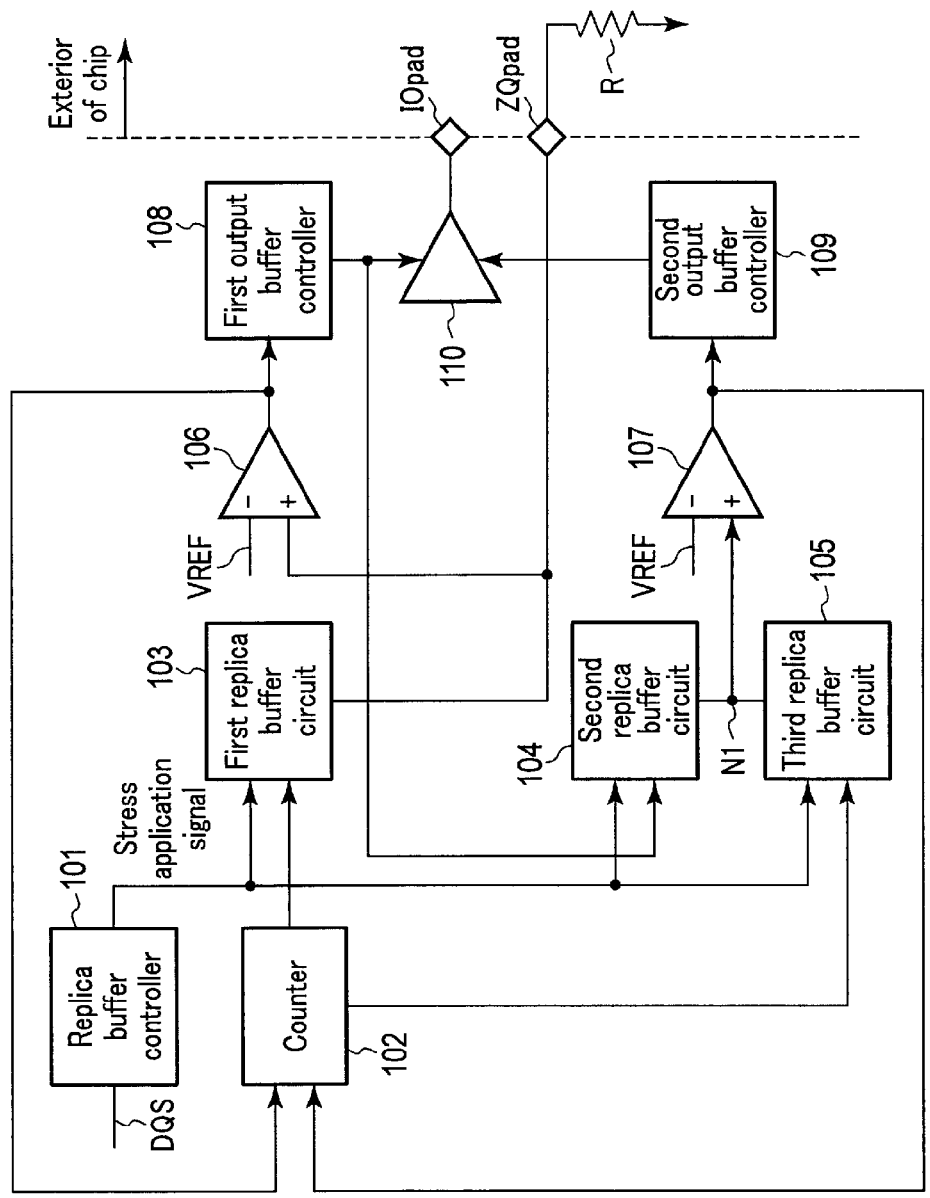
F I G. 2

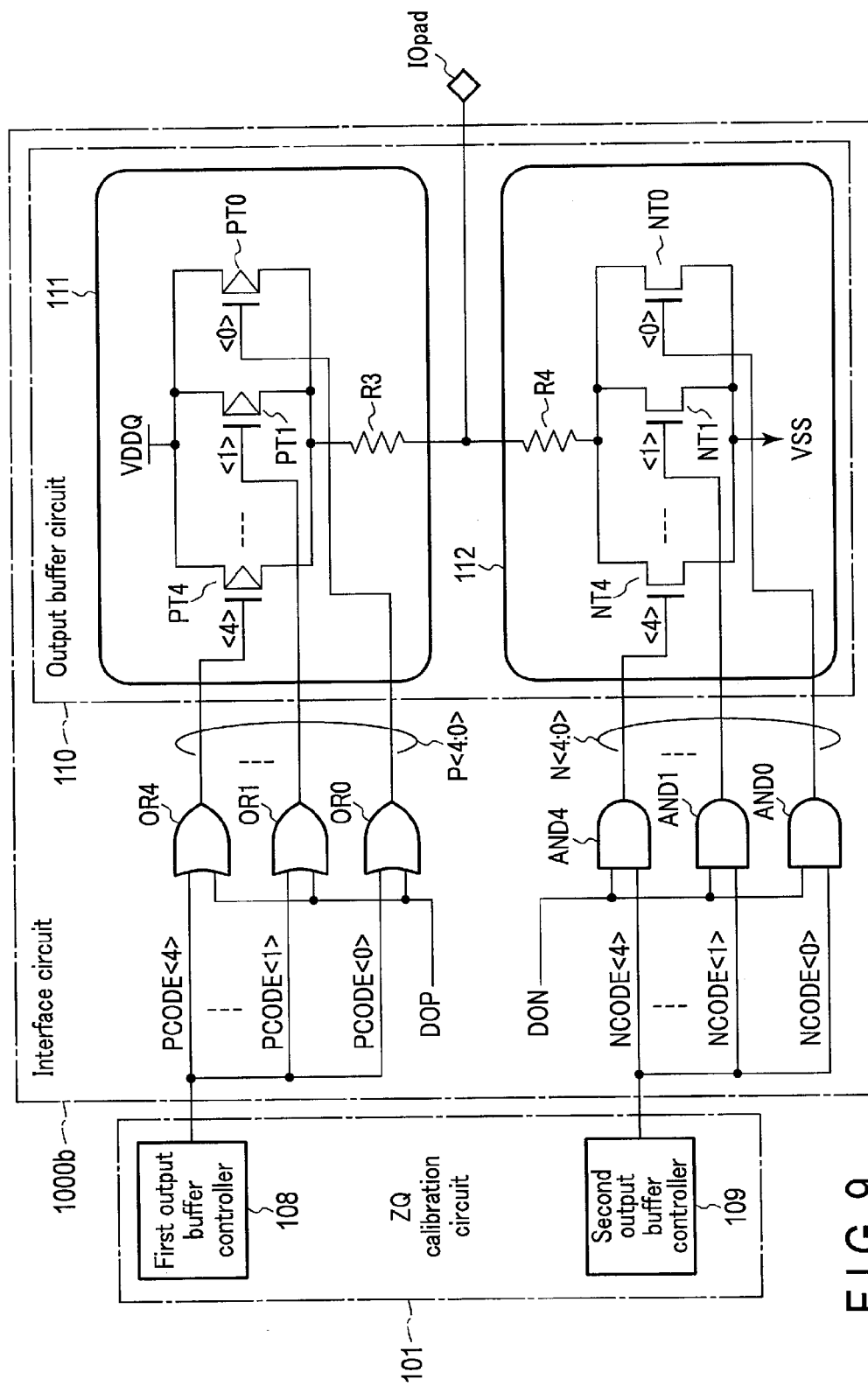
F I G. 9

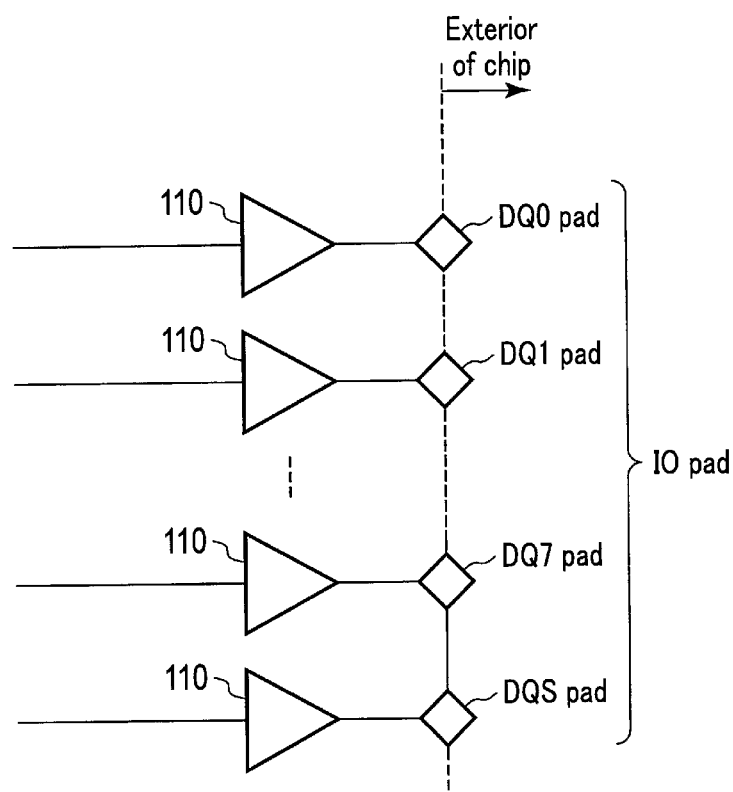
F I G. 10

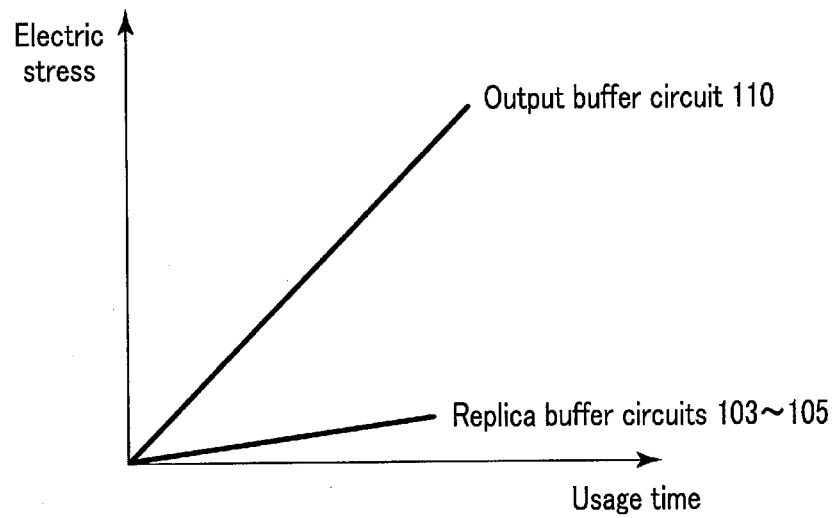
F I G. 15
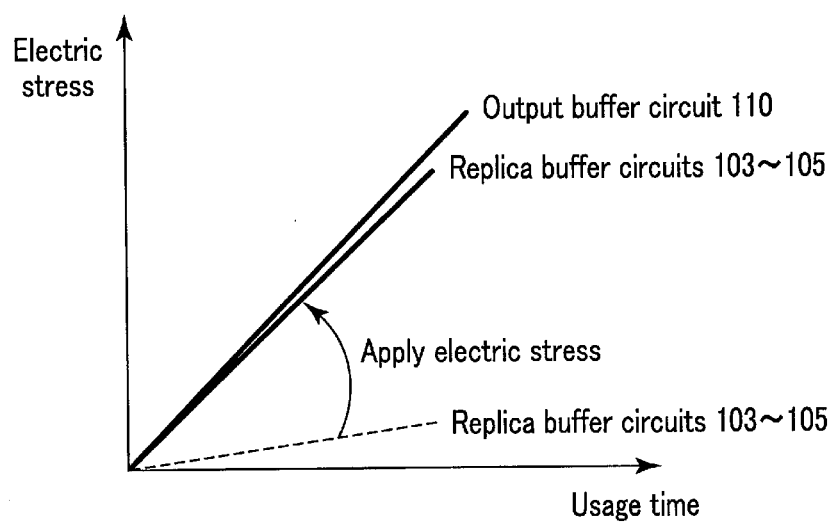
F I G. 16

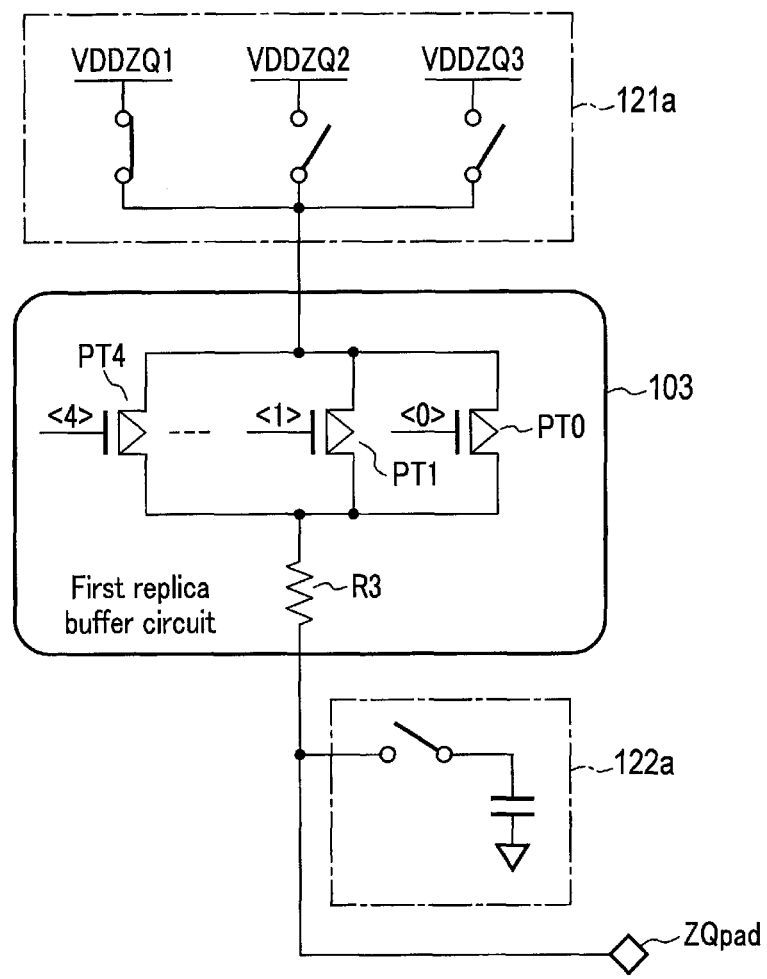
F I G. 17

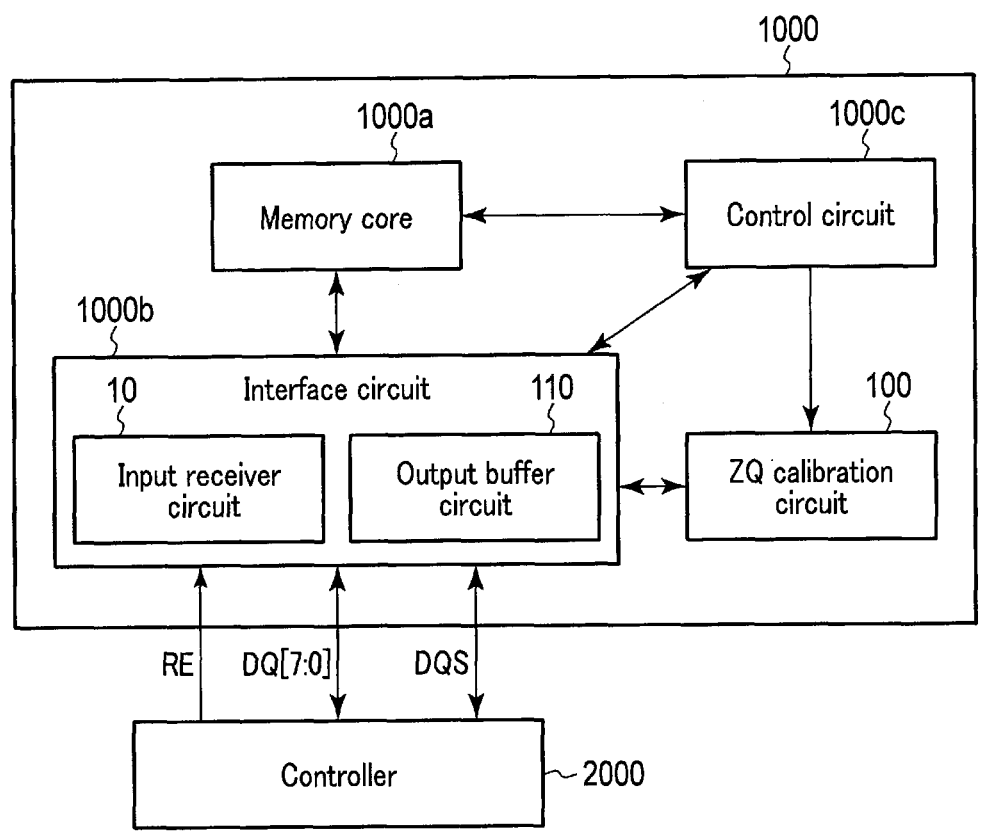
F I G. 19

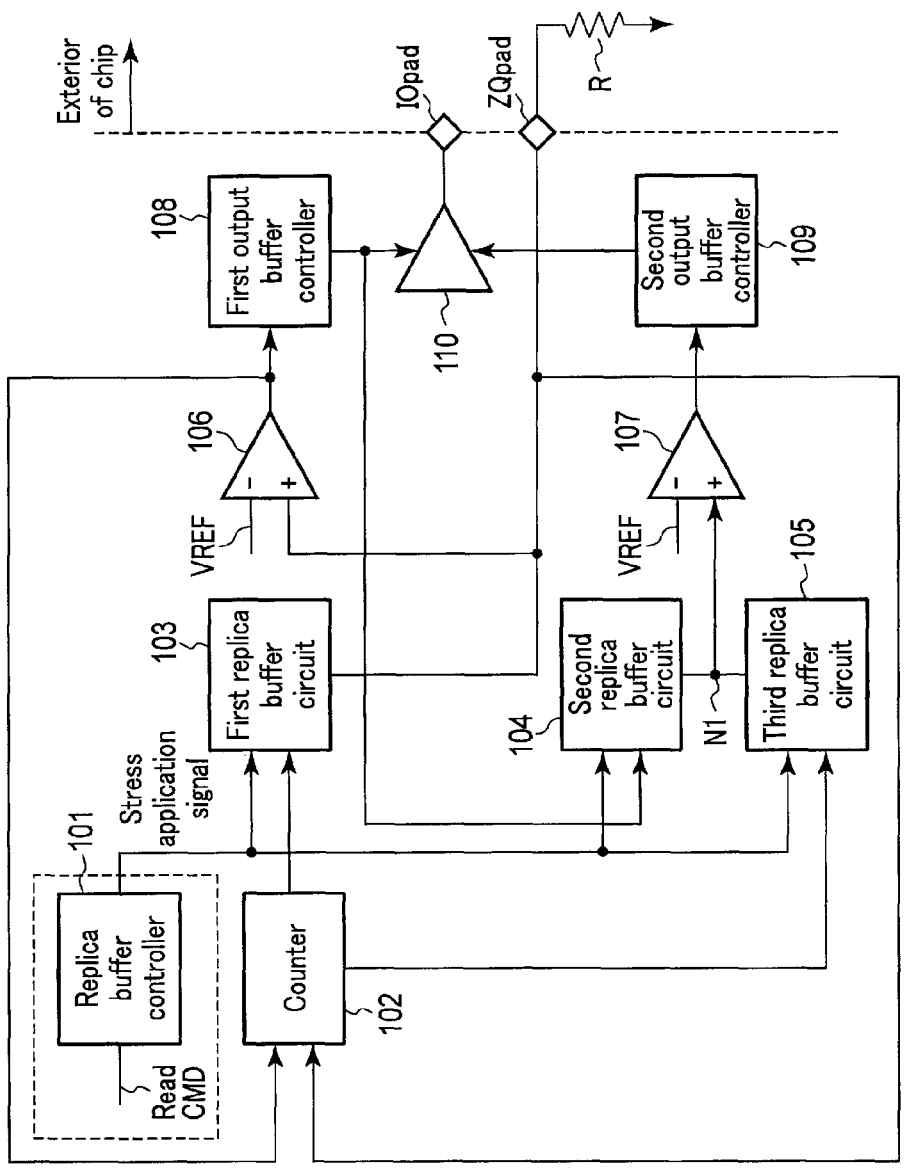
F I G. 20

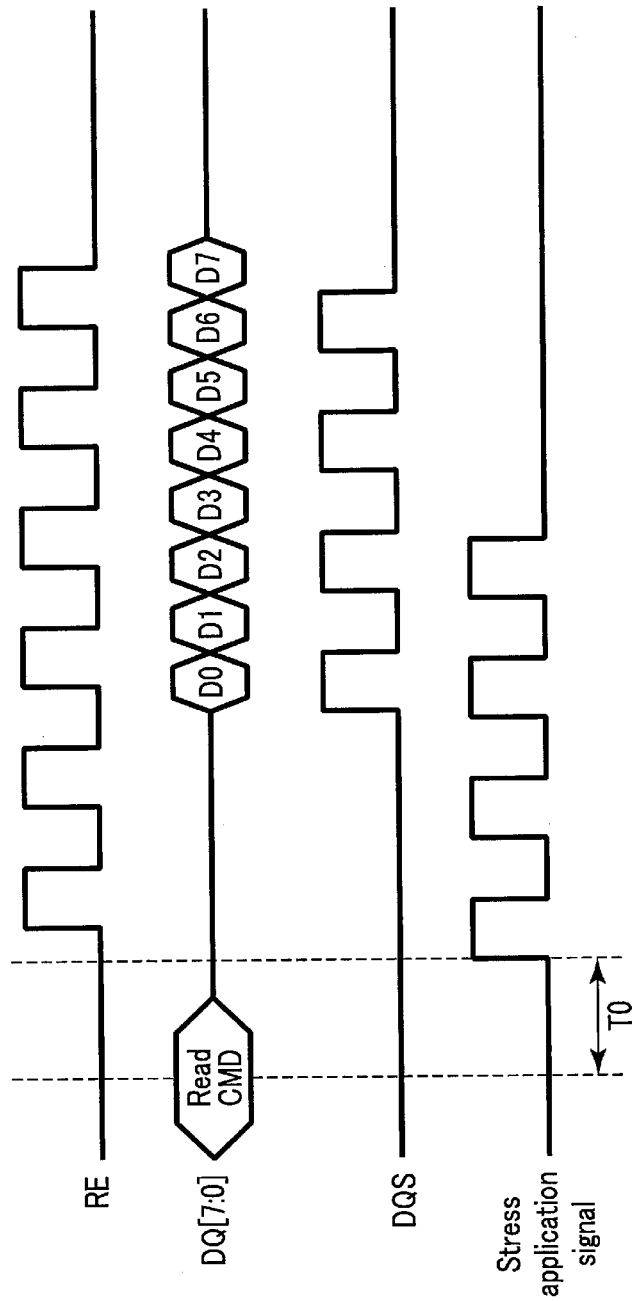
F I G. 21

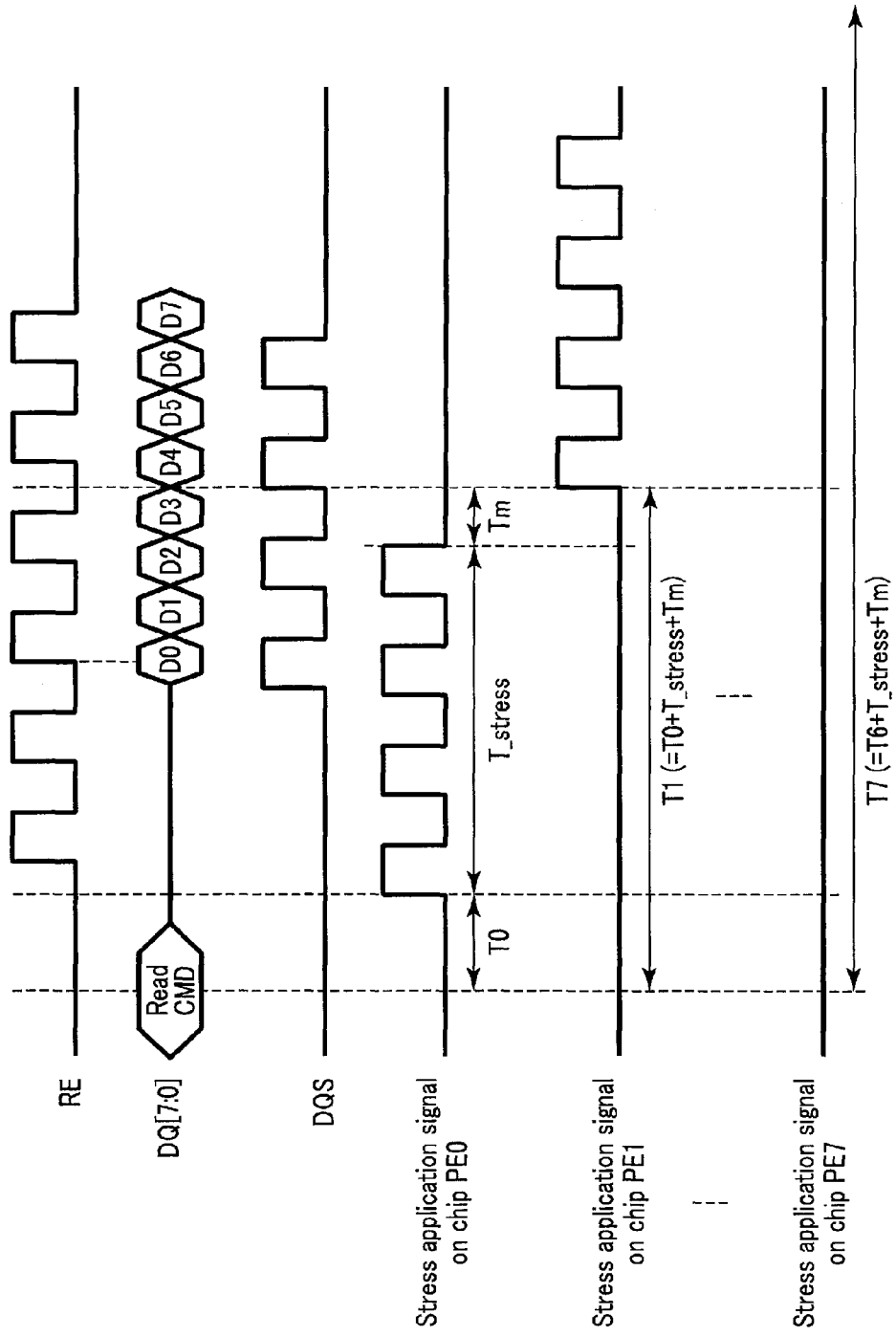
F I G. 23

| Usage status | Selection target |
|---|---|
| Range of number of receptions of read command | Selection signal name |
| $0 \leqq i < n$ | SEL<0> |
| $n \leqq i < m$ | SEL<1> |
| : | : |
| $p \leqq i$ | SEL<6> |

ZQ CALIBRATION CIRCUIT AND SEMICONDUCTOR DEVICE INCLUDING THE SAME

CROSS-REFERENCE TO RELATED APPLICATIONS

This application is based upon and claims the benefit of U.S. Provisional Application No. 62/214,517, filed Sep. 4, 2015, the entire contents of which are incorporated herein by reference.

FIELD

Embodiments relate to a ZQ calibration circuit and a semiconductor device with the ZQ calibration circuit.

BACKGROUND

A semiconductor device with a ZQ calibration circuit is known.

BRIEF DESCRIPTION OF THE DRAWINGS

FIG. 1 is a schematic diagram depicting a semiconductor device according to a first embodiment and a peripheral configuration therefor;

FIG. 2 is a schematic diagram depicting a ZQ calibration circuit according to the first embodiment and a peripheral configuration therefor;

FIG. 9 is a schematic diagram illustrating a configuration of an output buffer circuit according to the first embodiment;

FIG. 10 is a schematic diagram illustrating IO pads connected to the output buffer circuit according to the first embodiment;

FIG. 15 is a schematic diagram illustrating a relation between usage time and stress in the comparative example, illustrating the effects of the first embodiment;

FIG. 16 is a schematic diagram illustrating the relation between the usage time and the stress in the comparative example, illustrating the effects of the first embodiment;

FIG. 17 is a schematic diagram depicting the first replica buffer circuit according to a variation of the first embodiment and the peripheral configuration therefor;

FIG. 19 is a schematic diagram depicting a semiconductor device according to a second embodiment and a peripheral configuration therefor;

FIG. 20 is a schematic diagram depicting a ZQ calibration circuit according to the second embodiment and a peripheral configuration therefor;

FIG. 21 is a time chart illustrating an operation of inputting a stress application signal according to the first embodiment;

FIG. 23 is a time chart illustrating an operation of inputting a stress application signal according to the variation of the second embodiment;

DETAILED DESCRIPTION

Figure 3:
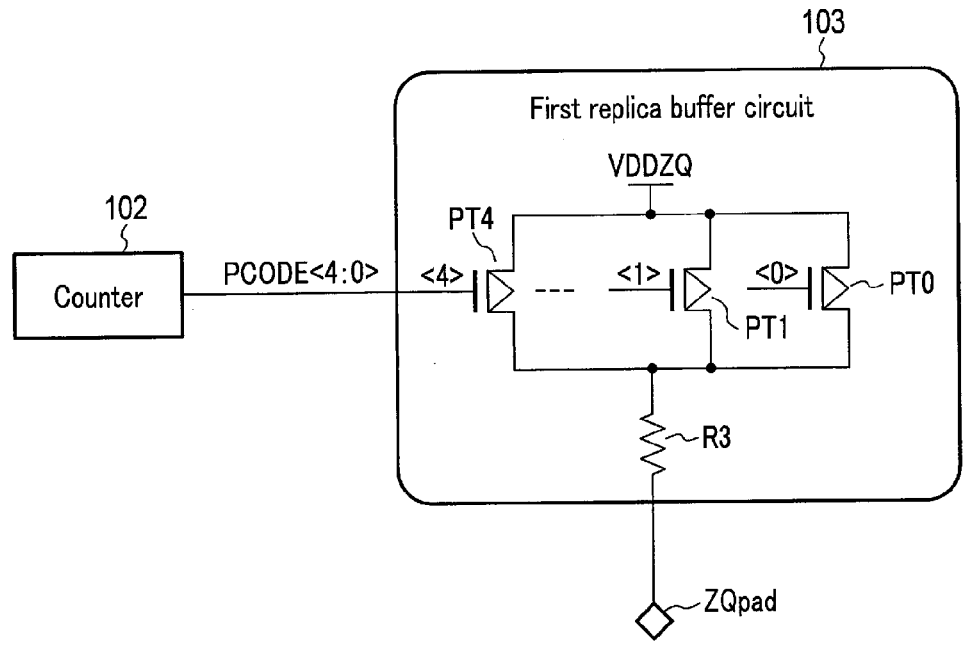
FIG. 3 is a schematic diagram illustrating a configuration of a first replica buffer circuit according to a first embodiment.

In general, according to one embodiment, there is provided a ZQ calibration circuit comprising: a replica buffer controller configured to apply electric stress to a replica buffer circuit with a circuit configuration substantially identical to a circuit configuration of an output buffer circuit according to a usage status of the output buffer circuit during a period when no calibration operation is performed.

Embodiments will be described below with reference to the drawings. For the description, components having substantially the same functions and configurations are denoted by the same reference numerals, and duplicate descriptions are given when needed. The embodiments illustrate apparatuses and methods for embodying the technical concepts of the embodiments. The technical concepts of the embodiments do not limit materials, shapes, structures, arrangements, and the like of the components to the following.

In the following embodiments, as the semiconductor device, a NAND flash memory will be described by way of example. However, the semiconductor device is not limited to this and may be, for example, an MRAM (Magnetic Random Access Memory) or a DRAM.

First Embodiment

[1-1] Configuration

[1-1-1] Configuration of the Semiconductor Device

A configuration of a semiconductor device according to a first embodiment will be described using FIG. 1. FIG. 1 is a schematic diagram depicting the semiconductor device according to the first embodiment and a peripheral configuration therefor.

As depicted in FIG. 1, a semiconductor device 1000 comprises a memory core 1000a, an interface circuit 1000b, and a control circuit 1000c. The interface circuit 1000b can communicate with a controller 2000.

The memory core 1000a has a memory cell array that stores data, so as to enable a data read process and a data write process to be executed on the memory cell array.

The interface circuit 1000b comprises an input receiver circuit 10 and an output buffer circuit 110.

The input receiver circuit 10, upon receiving a signal for input data or the like from the controller 2000, transfers a signal corresponding to the received signal to the memory core 1000a or the control circuit 1000c.

The output buffer circuit 110, upon receiving output data read (output) from the memory core 1000a, outputs a data signal corresponding to the output data to the external controller 2000 through IO pads.

The control circuit 1000c controls the memory core 1000a and the interface circuit 1000b in accordance with control signals received from the controller 2000. In addition, the control circuit 1000c has a ZQ calibration circuit 100 that calibrates an output impedance (drive intensity) of the output buffer circuit 110. The ZQ calibration allows compensation for fluctuation attributed to process, voltage, and temperature. The "output buffer circuit" may be interchanged with an "output driver circuit".

[1-1-2] Configuration of the ZQ Calibration

As depicted in FIG. 2, the ZQ calibration circuit 100 comprises a replica buffer controller 101, a counter 102, a first replica buffer circuit 103, a second replica buffer circuit 104, a third replica buffer circuit 105, a first comparator 106, a second comparator 107, a first output buffer controller 108, and a second output buffer controller 109. The first and second output buffer controllers 108 and 109 are connected to the output buffer circuit 110.

In this regard, the replica buffer controller 101 applies electric stress to the replica buffer circuits 103 to 105 having substantially the same circuit configuration as that of the output buffer circuit 110 while no calibration operation is performed. The replica buffer controller 101 may input a stress application signal that applies stress to the replica buffer circuits 103 to 105, for example, in response to a data signal DQ or a data strobe signal DQS output from the output buffer circuit 110.

When a calibration operation is performed on the first replica buffer circuit 103, the counter 102 updates a count value in accordance with an output signal from a first comparator 106. The counter 102 then delivers an impedance control signal indicative of the count value to first replica buffer circuit 103. For example, upon receiving a high-level output signal from the first comparator 106, the counter 102 updates the count value so as to count up. Similarly, upon receiving a low-level output signal from the first comparator 106, the counter 102 updates the count value so as to count down.

Thus, for example, in accordance with a comparison result obtained when the voltage of a ZQ pad is higher than a reference voltage VREF, the counted-up impedance control signal is delivered to the first replica buffer circuit 103. At this time, the impedance of the first replica buffer circuit 103 increases to reduce the voltage of the ZQ pad toward the reference voltage VREF.

Similarly, for example, in accordance with a comparison result obtained when the voltage of the ZQ pad is lower than the reference voltage, the counted-down impedance control signal is delivered to the first replica buffer circuit 103. At this time, the impedance of the first replica buffer circuit 103 decreases to increase the voltage of the ZQ pad toward the reference voltage VREF.

In either case, the counter 102 stops updating the counter value when the level of the output signal from the first comparator 106 is inverted. Then, the calibration operation performed on the first replica buffer circuit 103 is ended.

Furthermore, when the calibration operation is performed on the third replica buffer circuit 105, the counter 102 updates the count value in accordance with an output signal from the second comparator 107. The counter 102 then outputs an impedance control signal corresponding to the count value to the third replica buffer circuit 105. For example, upon receiving a high-level output signal from the second comparator 107, the counter 102 updates the count value so as to count up. Similarly, upon receiving a low-level output signal from the second comparator 107, the counter 102 updates the count value so as to count down.

Thus, for example, in accordance with a comparison result obtained when the voltage of an output node N1 is higher than the reference voltage VREF, the counted-up impedance control signal is delivered to the third replica buffer circuit 105. At this time, the impedance of the third replica buffer circuit 105 increases to rise the voltage of the output node N1 toward the reference voltage VREF.

Similarly, for example, in accordance with a comparison result obtained when the voltage of the ZQ pad is lower than the reference voltage VREF, the counted-down impedance control signal is delivered to the third replica buffer circuit 105. At this time, the impedance of the third replica buffer circuit 105 decreases to reduce the voltage of the output node N1 toward the reference voltage VREF.

In either case, the counter 102 stops updating the counter value when the level of the output signal from the second comparator 107 is inverted. Then, the calibration operation performed on the third replica buffer circuit 105 is ended.

Figure 4:
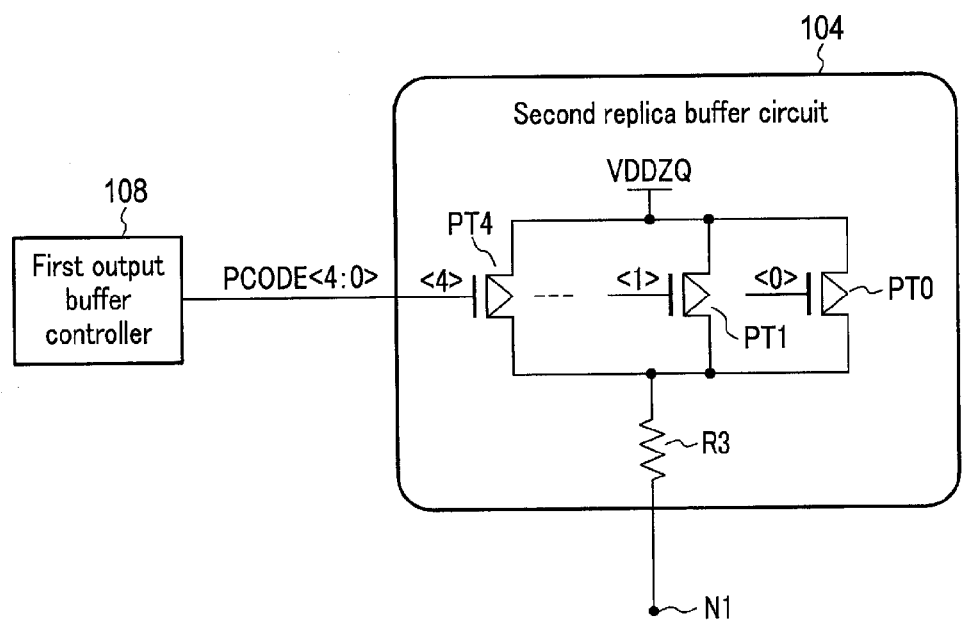
FIG. 4 is a schematic diagram illustrating a second replica buffer circuit according to the first embodiment.

Each of the first and second replica buffer circuits 103 and 104 is a replica of a pull-up circuit included in the output buffer circuit 110 connected to the IO pad as depicted in FIG. 3 and FIG. 4. Each of the first and second replica buffer circuits 103 and 104 comprises five P-channel MOS transistors PT0 to PT4 corresponding to the number of bits in an impedance control signal PCODE<4:0>, and a resistor R3. The transistors PT0 to PT4 are connected in parallel between a power supply VDDZQ and one end of the resistor R3. The impedance control signals PCODE<0> to PCODE<4> from the counter 102 or the first output buffer controller 108 are supplied to gates of the transistors PT0 to PT4, respectively. The other end of the resistor R3 in the first replica buffer circuit 103 is connected to the ZQ pad. The other end of the resistor R3 in the second replica buffer circuit 104 is connected to the output node N1. The "impedance control signal" may be interchanged with an "impedance setting code", a "gate signal", or the like as needed.

Figure 5:
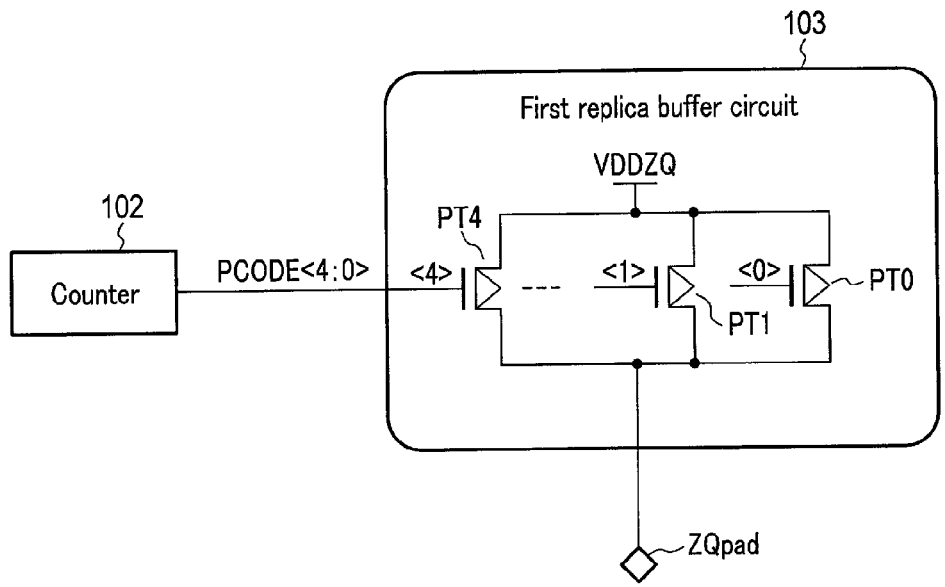
FIG. 5 is a schematic diagram illustrating a modified configuration of the first replica buffer circuit according to the first embodiment.
Figure 6:
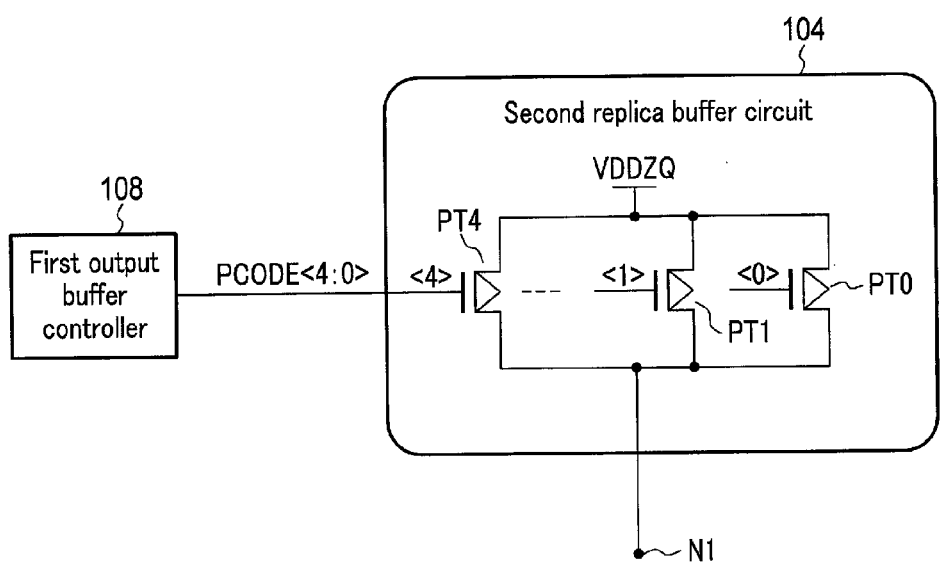
FIG. 6 is a schematic diagram illustrating a modified configuration of the second replica buffer circuit according to the first embodiment.

The transistors PT0 to PT4 are configured to have different sizes (on resistance). The impedance control signal PCODE<4:0> sent from the counter 102 or the first output buffer controller 108 is used to select any one of the transistors PT0 to PT4 with different sizes. A resistance value for the resistor R3 is set such that the sum of the resistance value for the resistor R3 and the on resistance of one transistor PT is approximately 240Ω. The resistance value for the resistor R3 is, for example, 20Ω. However, the resistor R3 may be omitted as depicted in FIG. 5 and FIG. 6.

Figure 7:
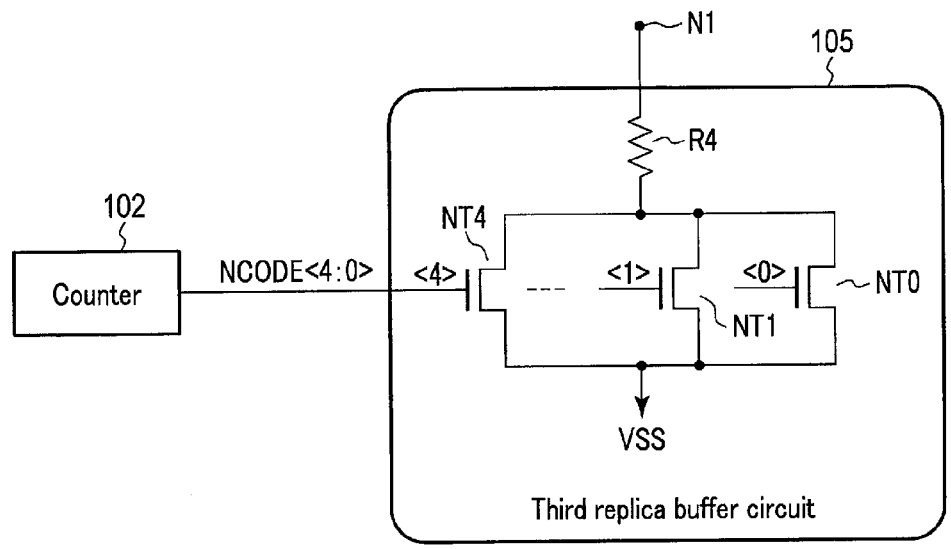
FIG. 7 is a schematic diagram illustrating a configuration of a third replica buffer circuit according to the first embodiment.

The third replica buffer circuit 105 is a replica of a pull-down circuit included in the output buffer circuit 110 connected to the IO pad as depicted in FIG. 7. The third replica buffer circuit 105 comprises five N-channel MOS transistors NT0 to NT4 corresponding to the number of bits in an impedance control signal NCODE<4:0>, and a resistor R4. One end of the resistor R4 is connected to the output node N1. The transistors NT0 to NT4 are connected in parallel between the other end of the resistor R4 and a power supply VSS. The impedance control signals NCODE<0> to NCODE<4> from the counter 102 are supplied to gates of the transistors NT0 to NT4, respectively.

Figure 8:
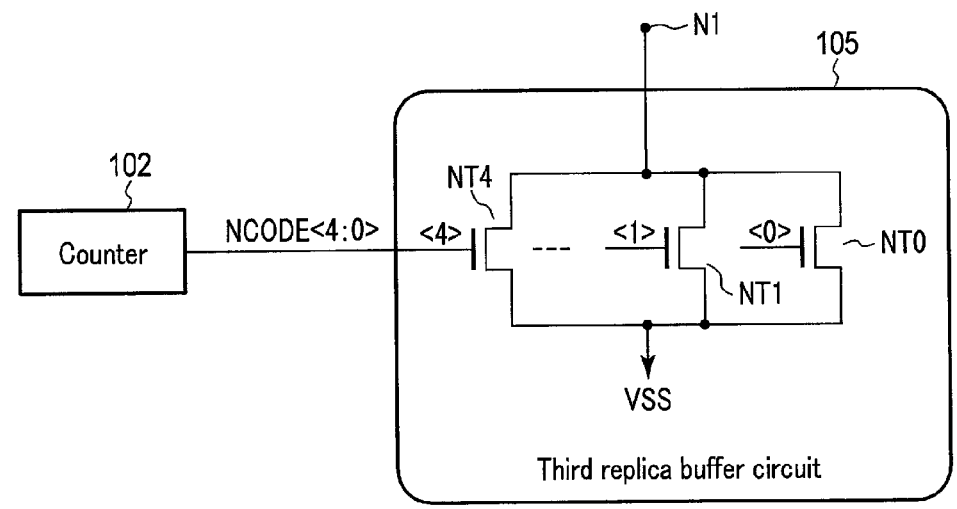
FIG. 8 is a schematic diagram illustrating a modified configuration of the third replica buffer circuit according to the first embodiment.

The transistors NT0 to NT4 are configured to have different sizes (on resistance). The impedance control signal NCODE<4:0> sent from the counter 102 is used to select any one of the transistors NT0 to NT4 with different sizes. A resistance value for the resistor R4 is set such that the sum of the resistance value for the resistor R4 and the on resistance of one transistor NT is approximately 240Ω. The resistance value for the resistor R4 is, for example, 20Ω. However, the resistor R4 may be omitted as depicted in FIG. 8.

The first comparator 106 is used to perform ZQ calibration on the first replica buffer circuit 103. A positive input terminal of the first comparator 106 is connected to the ZQ pad. A reference resistor R is connected between the ZQ pad and the power supply (ground potential) VSS. The reference resistor R is connected to the outside of a semiconductor chip. The reference resistor R is set to, for example, 240Ω. The reference voltage VREF is supplied to a negative input terminal of the first comparator 106. The reference voltage VREF is generated using resistors R1, R2 not depicted in the drawings. The resistors R1, R2 are connected in series between the power supply (power supply voltage) VDDZQ and the power supply VSS and are set such that R1=R2 (for example, approximately 2Ω). Consequently, VREF=VDDZQ/2 is set. The first comparator 106 compares the voltage of the ZQ pad input to the positive input terminal with the reference voltage VREF input to the negative input terminal. The first comparator 106 then delivers an output signal at a level corresponding to the result of the comparison to the counter 102 and the first output buffer controller 108. For example, the first comparator 106 delivers a high-level output signal in accordance with a comparison result obtained when the voltage of the ZQ pad is higher. Similarly, the first comparator 106 delivers a low-level output signal in accordance with a comparison result obtained when the reference voltage VREF is higher.

The second comparator 107 is used to perform ZQ calibration on the third replica buffer circuit 105. A positive input terminal of the second comparator 107 is connected to the output node N1 between the second replica buffer circuit 104 and the third replica buffer circuit 105. The above-described reference voltage VREF is supplied to a negative input terminal of the second comparator 107. The second comparator 107 compares the voltage of the output node N1 input to the positive input terminal with the reference voltage VREF input to the negative input terminal. The second comparator 107 then delivers an output signal at a level corresponding to the result of the comparison to the counter 102 and the second output buffer controller 109. For example, the second comparator 107 delivers a high-level output signal in accordance with a comparison result obtained when the voltage of the output node N1 is higher. Similarly, the second comparator 107 delivers a low-level output signal in accordance with a comparison result obtained when the reference voltage VREF is higher.

The first output buffer controller 108 sets an impedance obtained by the calibration of the first replica buffer circuit 103 in the pull-up circuit in the output buffer circuit 110 and for the second replica buffer circuit 104. Specifically, while the calibration operation is being performed on the first replica buffer circuit 103, the first output buffer controller 108 updates the count value in accordance with the output signal from the first comparator 106. When the level of the output signal is inverted, the first output buffer controller 108 stops updating the counter value. In this regard, the counter value provided by the first output buffer controller 108 is equal to the counter value provided by the counter 102 while the calibration operation is being performed on the first replica buffer circuit 103. Subsequently, the first output buffer controller 108 delivers the impedance control signal PCODE<4:0> indicating the count value obtained when the updating is ended, to the second replica buffer circuit 104. The impedance control signal PCODE<4:0> obtained when the updating is ended is also delivered to the pull-up circuit in the output buffer circuit 110 after the calibration of the third replica buffer circuit 105 is ended.

The second output buffer controller 109 sets an impedance obtained by the calibration of the third replica buffer circuit 105 in the pull-down circuit in the output buffer circuit 110. Specifically, while the calibration operation is being performed on the third replica buffer circuit 105, the second output buffer controller 109 updates the count value in accordance with the output signal from the second comparator 107. When the level of the output signal is inverted, the second output buffer controller 109 stops updating the counter value. In this regard, the counter value provided by the second output buffer controller 109 is equal to the counter value provided by the counter 102 while the calibration operation is being performed on the third replica buffer circuit 105. Subsequently, the second output buffer controller 109 delivers the impedance control signal NCODE<4:0> indicating the count value obtained when the updating is ended, to the pull-down circuit in the output buffer circuit 110.

[1-1-3] Configuration of the Output Buffer Circuit

As depicted in FIG. 9, the output buffer circuit 110 comprises a pull-up circuit 111 and a pull-down circuit 112. FIG. 9 depicts one IO pad and an output driver circuit 110 connected to the IO pad. In actuality, a plurality of DQ pads and DQS pads and a corresponding number of output driver circuits 110 are provided as depicted in FIG. 10. Each of the pads is also an IO pad as depicted in FIG. 2 and FIG. 10. The DQ pad is a terminal through which the data signal DQ is received and output. The DQS pad is a terminal through which the data strobe signal DQS is received and output. In FIG. 10, illustration of a path for input signals from the IO pad to the input receiver circuit 10 is omitted.

Figure 11:
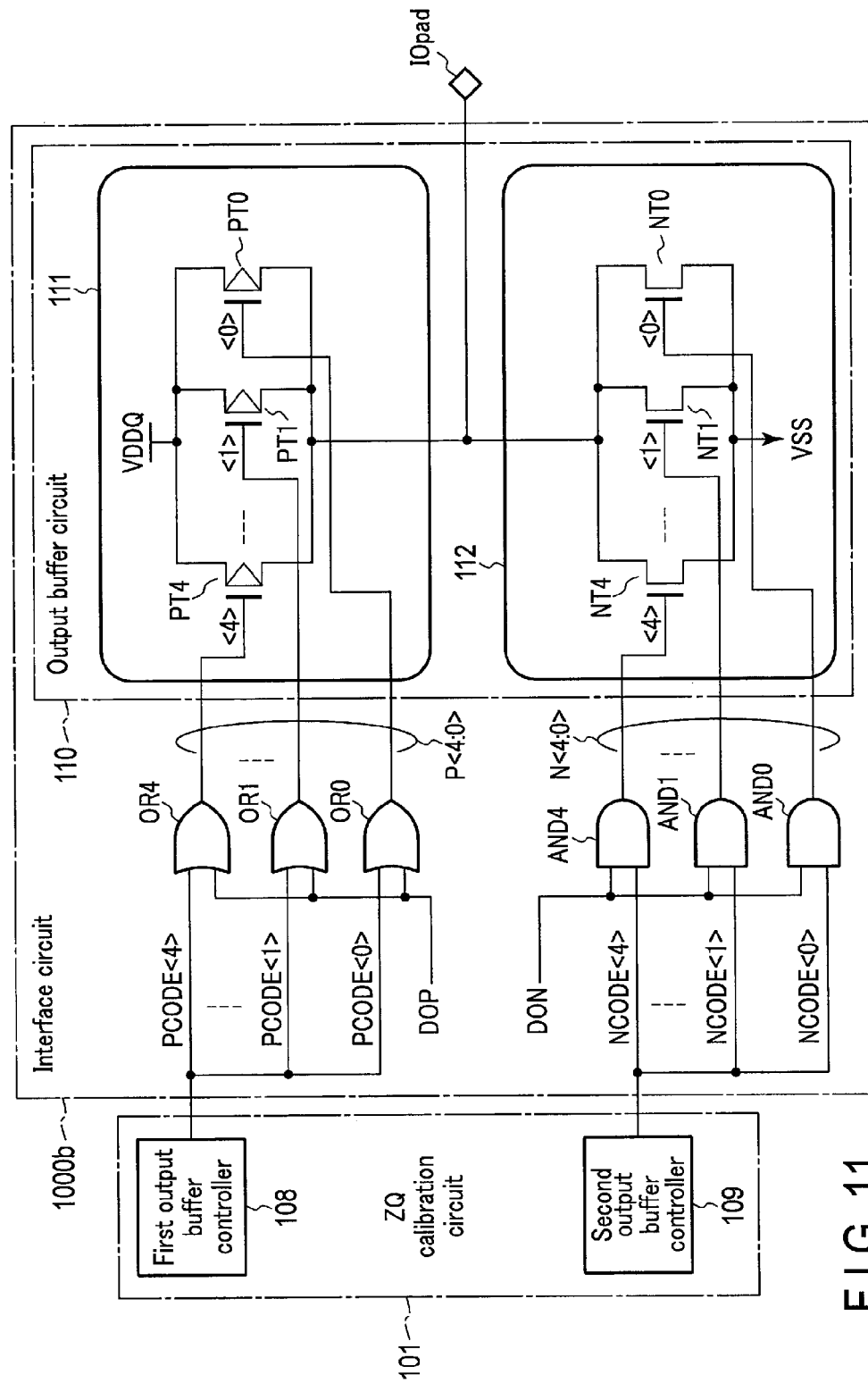
FIG. 11 is a schematic diagram illustrating a modified configuration of the output buffer circuit according to the first embodiment.

The pull-up circuit 111 has substantially the same circuit configuration as that of the first and second replica buffer circuits 103, 104 in FIG. 3 and FIG. 4. The pull-up circuit 111 receives an operation signal P<4:0> indicative of a logical sum (OR calculation result) of the impedance control signal PCODE<4:0> and a pull-up signal DOP. Then, a transistor PT corresponding to an activated bit in the operation signal P<4:0> is turned on. In this regard, the pull-up signal DOP and a pull-down signal DON described below are controlled in accordance with the level of the data signal output through the IO pad. For example, when the high-level data signal is output through the IO pad, the pull-up signal DOP and the pull-down signal DON are controlled to a low level by the interface circuit 1000b. When the low-level data signal is output through the IO pad, the pull-up signal DOP and the pull-down signal DON are controlled to a high level by the interface circuit 1000b. When the output buffer circuit 110 is used as a termination circuit, the pull-up signal DOP is controlled to the low level, and the pull-down signal DON is controlled to the high level. The operation signal P<4:0> includes output signals from five OR circuits OR0 to OR4 to which the impedance control signal PCODE<4:0> and the pull-up signal DOP are input. The power supply VDDQ is provided to the pull-up circuit 111, which is connected to the IO pad. The resistor R3 in the pull-up circuit 111 may be omitted as depicted in FIG. 11. The pull-up circuit 111 depicted in FIG. 11 has substantially the same circuit configuration as that of the first and second replica buffer circuits 103, 104 in FIG. 5 and FIG. 6.

Similarly, the pull-down circuit 112 has substantially the same circuit configuration as that of the third replica buffer circuit 105 in FIG. 7. The pull-down circuit 112 receives an operation signal N<4:0> indicative of a logical product (AND calculation result) of the impedance control signal NCODE<4:0> and the pull-down signal DON. Then, a transistor NT corresponding to an activated bit in the operation signal N<4:0> is turned on. The operation signal N<4:0> includes output signals from five AND circuits AND0 to AND4 to which the impedance control signal PCODE<4:0> and the pull-down signal DON are input. The pull-down circuit 112 is connected in parallel with the IO pad and provided with the power supply VSS. The resistor R4 in the pull-down circuit 112 may be omitted as depicted in FIG. 11. The pull-down circuit 112 depicted in FIG. 11 has substantially the same circuit configuration as that of the third replica buffer circuit 105 in FIG. 8.

The number of transistors PT included in the pull-up circuit 111 may be optionally set. Similarly, the number of transistors NT included in the pull-down circuit 112 may be optionally set. Furthermore, the number of transistors included in the replica buffer circuit is set so as to correspond to the output buffer circuit.

[1-2] Operations

Now, operations of the semiconductor device with the ZQ calibration circuit will be described with reference to FIG. 12 and FIG. 13. In the following description, the ZQ calibration operation and an operation of inputting a stress application signal will be described in order.

[1-2-1] ZQ Calibration Operation

Figure 12:
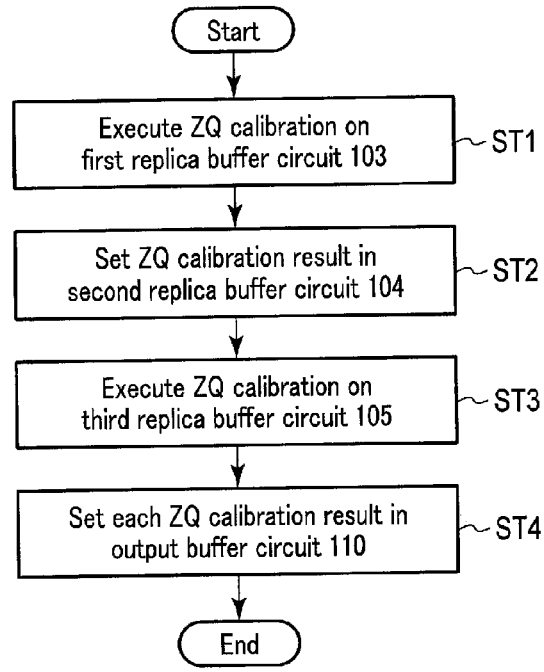
FIG. 12 is a flowchart illustrating a ZQ calibration operation according to the first embodiment.

As illustrated in FIG. 12, the ZQ calibration circuit 100 executes the ZQ calibration on the pull-up-side first replica buffer circuit 103 (ST1) to generate a pull-up-side impedance control signal PCODE<4:0>. That is, in step ST1, the counter 102 counts up or down the counter value indicated in the impedance control signal PCODE<4:0> until the voltage of the ZQ pad is substantially the same as the reference voltage VREF. The first replica buffer circuit 103 turns on the transistor PT selected by the impedance control signal PCODE<4:0>. Thus, the voltage of the ZQ pad is adjusted. When the voltage of the ZQ pad is substantially the same as the reference voltage VREF, the operation of the counter 102 is stopped, and the impedance control signal PCODE<4:0> is generated which is a pull-up-side calibration result.

After step ST1, the first output buffer controller 108 sets the impedance control signal PCODE<4:0> resulting from step ST1 in the second replica buffer circuit 104 (ST2).

After step ST2, the ZQ calibration circuit 100 executes the ZQ calibration on the pull-down-side third replica buffer circuit 105 (ST3) to generate a pull-down-side impedance control signal NCODE<4:0>. That is, in the preceding step ST2, the pull-up-side impedance of the output node N1 has already been set in the second replica buffer circuit 104. In step S3, the counter 102 counts up or down the counter value indicated in the impedance control signal NCODE<4:0> until the voltage of the output node N1 is substantially the same as the reference voltage VREF. The third replica buffer circuit 105 turns on the transistor NT selected by the impedance control signal NCODE<4:0>. Thus, the voltage of the output node N1 is adjusted. When the voltage of the output node N1 is substantially the same as the reference voltage VREF, the operation of the counter 102 is stopped, and the impedance control signal NCODE<4:0> is generated which is a pull-down-side calibration result.

After step ST3, the impedance control signal PCODE<4:0> resulting from steps ST1, ST3 and the impedance control signal NCODE<4:0> are sent to the output driver circuit 110 connected to the IO pad. The output impedance of the output driver circuit 110 is set based on the impedance control signal PCODE<4:0> and the impedance control signal NCODE<4:0> (ST4).

[1-2-2] Operation of Inputting the Stress Application Signal

Figure 13:
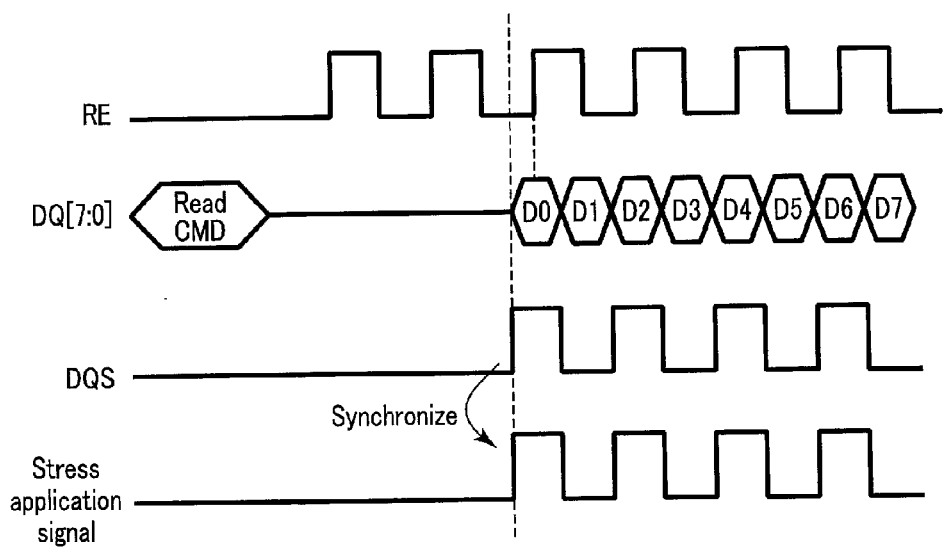
FIG. 13 is a time chart illustrating an operation of inputting a stress application signal according to the first embodiment.

As illustrated in FIG. 13, the controller 2000 transmits a read command and clock signals such as a read enable signal RE to the semiconductor device 1000.

The interface circuit 1000b in the semiconductor device 1000 reads data from the memory cell array in accordance with a received read command CMD. Furthermore, the interface circuit 1000b transmits the data strobe signal DQS and the data signal DQ, which is read data, from the output buffer circuit 110 to the controller 2000.

The controller 2000 retrieves data from the data signal DQ, which synchronizes with the data strobe signal DQS. The data strobe signal DQS is a clock signal used to accurately deliver data between the controller 2000 and the interface circuit 1000b.

At the time of such data read, the output buffer circuit 110 is subjected to electric stress depending on a usage status, which gradually degrades the characteristics thereof.

In contrast, in the ZQ calibration circuit 100 according to the present embodiment, the replica buffer controller 101 inputs a stress application signal that synchronizes with the data signal DQ or the data strobe signal DQS, to the replica buffer circuits 103, 104, 105.

The replica buffer circuits 103, 104, 105 are driven by the input stress application signal (gate signal) to pass a current through the transistors in the replica buffer circuits 103, 104, 105. The current causes the replica buffer circuits 103, 104, 105 to be subjected to electric stress similar to the electric stress suffered by the output buffer circuit 110 during use. That is, the usage status for the replica buffer circuits 103, 104, 105 grows similar to the usage status for the output buffer circuit 110. Furthermore, the replica buffer circuits 103, 104, 105 and the output buffer circuit 110 are subjected to similar electric stress and the characteristics thereof degrade.

When the ZQ calibration is executed using the replica buffer circuits 103, 104, 105 with the degradation of the characteristics thereof adjusted as described above, the calibration can be executed so as to provide the desired impedance even when the characteristics of the output buffer circuit 110 are significantly degraded.

[1-3] Effects According to the First Embodiment

According to the present embodiment, electric stress is applied to the replica buffer circuits 103 to 105 used for the ZQ calibration circuit 100 to allow execution of the appropriate calibration to deal with the degradation of the characteristics of the output buffer circuit 110.

Figure 14:
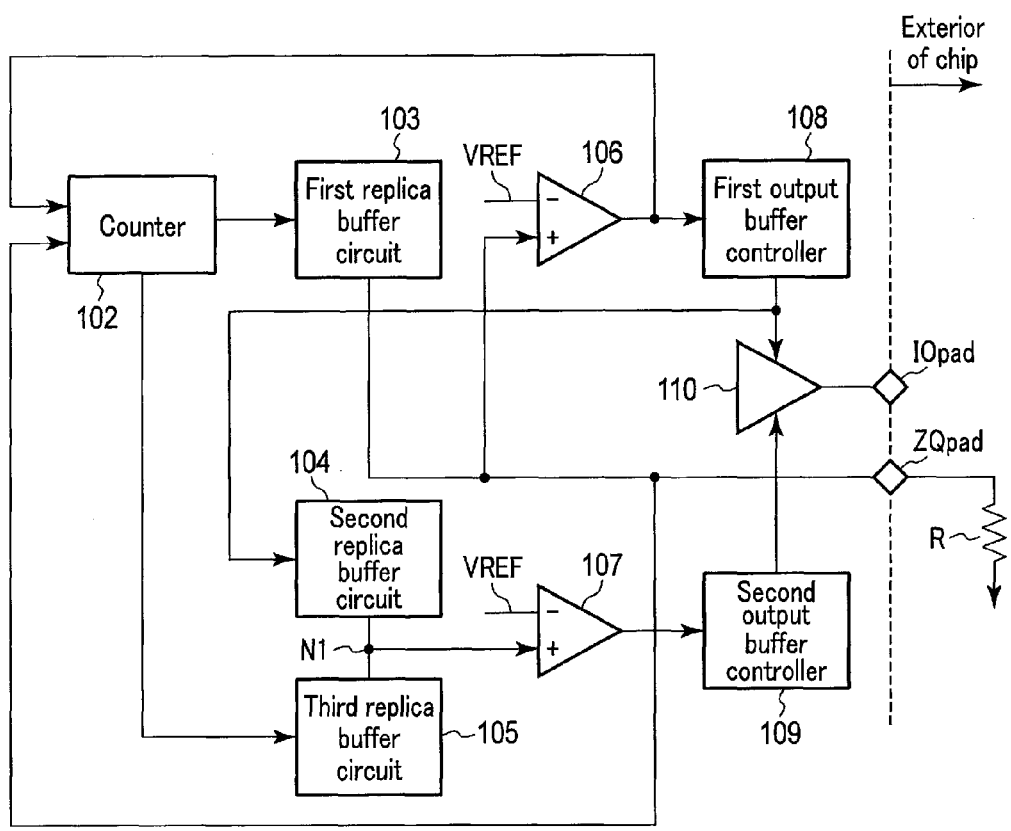
FIG. 14 is a schematic diagram depicting a configuration of a comparative example, illustrating effects of the first embodiment.

Now, effects of the present embodiment will be described taking a ZQ calibration circuit depicted in FIG. 14, as a comparative example. The ZQ calibration circuit in the comparative example corresponds to the configuration depicted in FIG. 2 and from which the replica buffer controller 101 is omitted. The ZQ calibration circuit in the comparative example enables the appropriate ZQ calibration by using the high-precision resistor R connected to the external ZQ pad and the first to third replica buffer circuits 103 to 105. In general, when signals are communicated between a semiconductor device such as a memory and a controller, an appropriate signal quality is needed. For the recent high-speed interfaces, it is essential to appropriately calibrate the output impedance of the semiconductor device in order to maintain signal quality. The ZQ calibration circuit in the comparative example enables the appropriate ZQ calibration as described above.

The ZQ calibration circuit in such a comparative example normally poses no problem. However, the inventors' examinations indicate that the ZQ calibration circuit in such a comparative example has room for improvement in that the comparative example fails to adjust the degradation of the characteristics depending on the usage status for the output buffer circuit 110 such as usage frequency or usage time. In general, when a current is passed through the output buffer circuit 110 during use, electric stress is applied to the output buffer circuit 110, and the characteristics thereof gradually degrade due to a hot carrier effect, as illustrated in FIG. 15. In contrast, the replica buffer circuits 103 to 105 used for the ZQ calibration are used less frequently than the output buffer circuit 110 and are thus unlikely to be subjected to the degradation of the characteristics. Thus, as the usage time elapses, a characteristic difference occurs between the output buffer circuit 110 and the replica buffer circuits 103 to 105, precluding the appropriate ZQ calibration from being executed.

On the other hand, in the present embodiment, electric stress is applied to the replica buffer circuits 103 to 105 according to the usage status to adjust the characteristics of the replica buffer circuits 103 to 105 so as to make the characteristics of the replica buffer circuits 103 to 105 compatible with the characteristics of the output buffer circuit 110 as depicted in FIG. 16. Therefore, the present embodiment allows the appropriate calibration to be executed so as to deal with the degraded characteristics of the output buffer circuit 110.

[1-4] Variations According to the First Embodiment

[1-4-1] First Variation

A first variation of the ZQ calibration circuit 100 according to the first embodiment will be described. This variation is different from the above-described first embodiment in that the replica buffer controller 101 adjusts the frequency or duty ratio of the stress application signal. Specifically, for example, the replica buffer controller 101 inputs the stress application signal pre-adjusted according to a setting for at least one of the frequency and the duty ratio to the replica buffer circuits 103 to 105.

Thus, the replica buffer controller 101 can adjust the degree of degradation of the characteristics of the replica buffer circuits 103, 104, 105. In addition, the replica buffer controller 101, for example, inputs the stress application signal with the frequency or the like adjusted so as to apply high electric stress, to the replica buffer circuits 103 to 105, enabling a reduction in time needed to adjust the degradation of the characteristics.

[1-4-2] Second Variation

Figure 18:
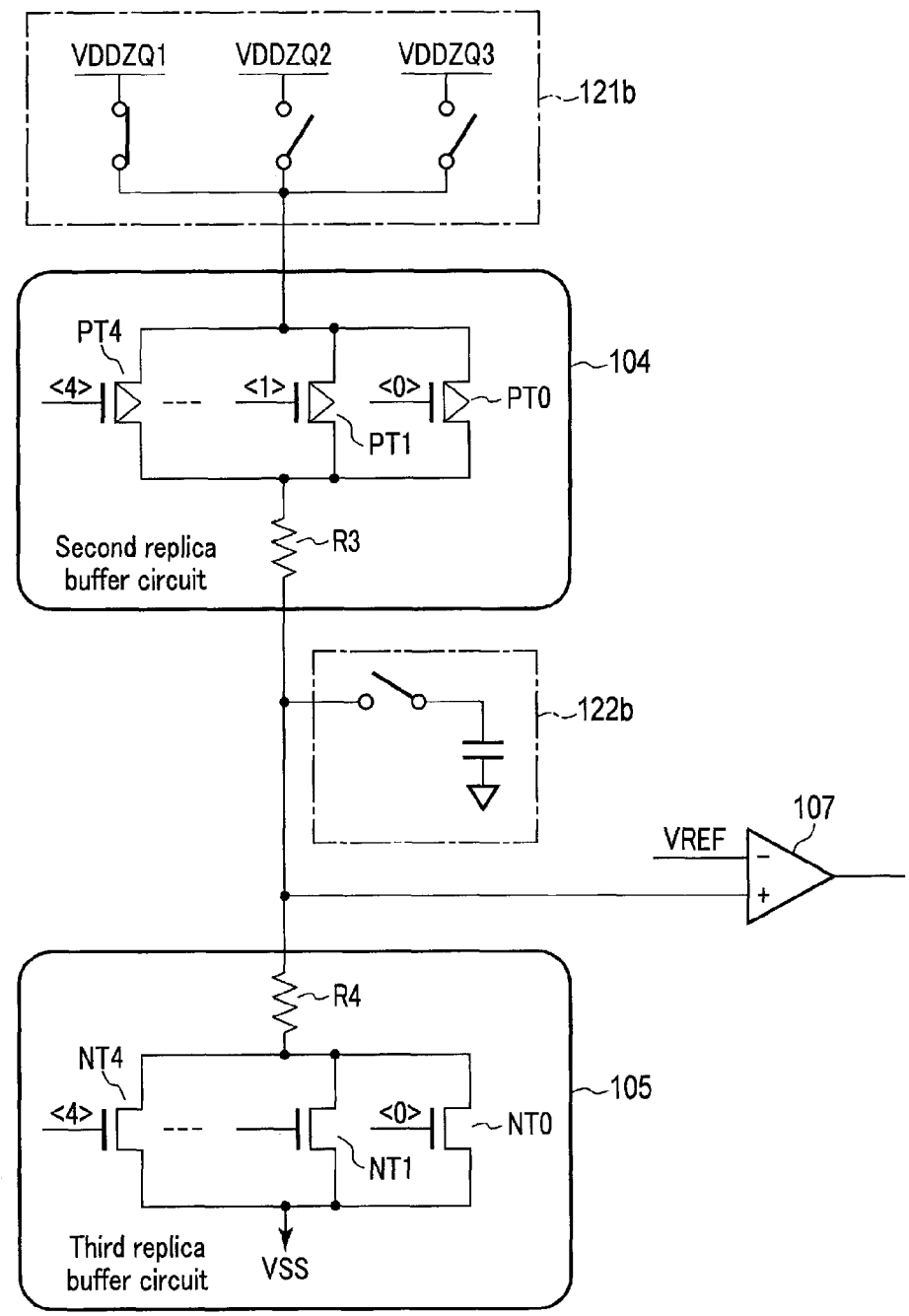
FIG. 18 is a schematic diagram depicting the second and third replica buffer circuits according to a variation of the first embodiment and the peripheral configuration therefor.

A second variation of the ZQ calibration circuit 100 according to the first embodiment will be described using FIG. 17 and FIG. 18. This variation is different from the first embodiment in that the load-carrying capacity or power supply voltage of the replica buffer circuits 103, 104, 105 is adjustable in order to regulate the degree of the degradation of the replica buffer circuits 103, 104, 105.

As illustrated, the ZQ calibration circuit 100 comprises first adjustment circuits 121a, 121b that adjust the power supply voltages VDDZQ of the replica buffer circuits 103 to 105. Furthermore, the ZQ calibration circuit 100 comprises second adjustment circuits 122a, 122b that adjust the load-carrying capacities of the replica buffer circuits 103 to 105. The first adjustment circuits 121a, 121b have the same configuration. The second adjustment circuits 122a, 122b have the same configuration. Thus, the first adjustment circuit 121a and the second adjustment circuits 122a will be described by way of example. The present variation illustrates the case where the ZQ calibration circuit comprises both the first adjustment circuits 121a, 121b and the second adjustment circuits 122a, 122b. However, the present invention is not limited to this, and the ZQ calibration circuit comprises either the first adjustment circuits 121a, 121b or the second adjustment circuits 122a, 122b.

The first adjustment circuit 121a comprises a switch that connects any one of the power supply voltages (lines) VDDZQ1, VDDZQ2, VDDZQ3 with different values to the first replica buffer circuit 103. Thus, the first adjustment circuit 121a can adjust the power supply voltage of the first replica buffer circuit 103 according to an on/off state of the switch controlled by the replica buffer controller 101.

The second adjustment circuit 122a comprises a switch that enables the load-carrying capacity and the first replica buffer circuit 103 to be interlinked. Thus, the second adjustment circuit 122a allows the load-carrying capacity of the first replica buffer circuit 103 according to the preset on/off state of the switch.

Therefore, the ZQ calibration circuit 100 can adjust the degree of degradation of the characteristics of the replica buffer circuits 103, 104, 105 when the replica buffer circuits 103, 104, 105 receive the stress application signal. In addition, the ZQ calibration circuit 100 can, for example, input the stress application signal to the replica buffer circuits 103 to 105 with the power supply voltages or the like therefor adjusted so as to be subjected to high electric stress, to enable a reduction in time needed to adjust the degradation of the characteristics.

Second Embodiment

[2-1] Configuration

[2-1-1] Configuration of the Semiconductor Device

Now, a semiconductor device according to a second embodiment will be described. FIG. 19 is a schematic diagram depicting the semiconductor device according to the second embodiment and a peripheral configuration therefor. FIG. 20 is a schematic diagram depicting the ZQ calibration circuit according to the second embodiment and a peripheral configuration therefor.

The second embodiment is a variation of the first embodiment that uses a modified timing to input the stress application signal.

Specifically, the replica buffer controller 101 according to the first embodiment inputs the stress application signal based on the data strobe signal DQS or the data signal DQ.

In contrast, the replica buffer controller 101 according to the second embodiment responds to the read command to input the stress application signal that applies electric stress, to the replica buffer circuits 103 to 105, as depicted by a dashed line in FIG. 20.

[2-2] Operation

As depicted in FIG. 21, the controller 2000 transmits the read command and the clock signals such as the read enable signal RE to the semiconductor device 1000.

The interface circuit 1000b in the semiconductor device 1000 reads data from the memory cell array in accordance with the received read command CMD. Furthermore, the interface circuit 1000b transmits the data strobe signal DQS and the data signal DQ, which is read data, from the output buffer circuit 110 to the controller 2000.

The controller 2000 retrieves data from the data signal DQ, which synchronizes with the data strobe signal DQS.

In such data read, the output buffer circuit 110 is subjected to electric stress depending on the usage status, and the characteristics thereof gradually degrade.

In contrast, in the ZQ calibration circuit 100 according to the present embodiment, the replica buffer controller 101 inputs the stress application signal to the replica buffer circuits 103, 104, 105 at a timing later than a timing for the read command CMD by a predetermined period T0.

As described above, the replica buffer circuits 103, 104, 105 are subjected by the input stress application signal to electric stress similar to the electric stress suffered by the output buffer circuit 110, and the characteristics of the replica buffer circuits 103, 104, 105 similarly degrade.

Similarly, when the ZQ calibration is executed using the replica buffer circuits 103, 104, 105 with the degradation of the characteristics thereof adjusted, the desired impedance can be calibrated even if the characteristics of the output buffer circuit 110 are significantly degraded.

[2-3] Effects According to the Second Embodiment

The present embodiment not only exerts the effects of the first embodiment but also enables the timing to input the stress application signal to be set to any timing based on the read command, allowing the degree of freedom of operations to be improved. Further, the replica buffer controller 101 need not synchronize with the data signal DQ or the data strobe signal DQS, and thus, can input the stress application signal at any timing after reception of the read command.

[2-4] Variation of the Second Embodiment

Figure 22:
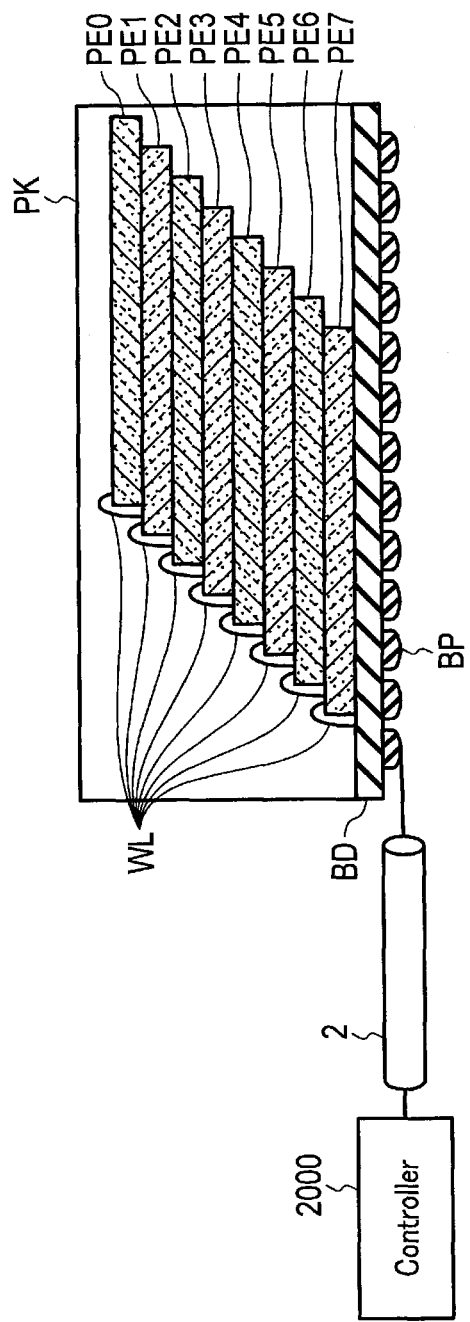
FIG. 22 is a schematic diagram depicting the semiconductor device according to a variation of the second embodiment and the peripheral configuration therefor.

A variation of the semiconductor device according to the second embodiment will be described using FIG. 22 and FIG. 23. This variation is different from the first embodiment in that the semiconductor device 1000 comprises, in the same package PK, a stack structure of a plurality of semiconductor chips PE0 to PE7 that can operate in parallel. In the package PK in the variation, the semiconductor chips PE0 to PE7 are stacked in steps on a circuit board BD. In this regard, each of the semiconductor chips PE0 to PE7 includes pad electrodes such as the above-described IO pad and ZQ pad, the memory core 1000a, the interface circuit 1000b, the control circuit 1000c, and the ZQ calibration circuit 100. The semiconductor chips PE0 to PE7 are stacked so as to be displaced from one another to allow the pad electrodes to be exposed. In this regard, the semiconductor chips PE0 to PE7 may be stacked, for example, via bonding layers or by junction of the electrodes. The pad electrodes are connected to IO terminals BP via bonding wires WL. The IO terminals BP are connected to the controller 2000 via a transmission line 2.

When such semiconductor chips PE0 to PE7 operate in parallel and the stress application signal is input to the semiconductor chips PE0 to PE7 at the same timing, a large peak current may be generated. In contrast, for example, the replica buffer controller 101 in the semiconductor chip PE0 coordinates the timing to input the stress application signal with the replica buffer controllers 101 in the other semiconductor chips PE1 to PE7, which operate in parallel in the same package PK. Specifically, the replica buffer controller 101 in each of the semiconductor chips PE0 to PE7 coordinates the timing to input the stress application signal so as to shift the timing among the other semiconductor chips PE0 to PE7 as illustrated in FIG. 23. For example, the input timing in the zeroth semiconductor chip PE0 is assumed to be a zeroth predetermined period T0 after the read command. In this case, the input timing in the next, first semiconductor chip PE1 is a first predetermined period T1 after the read command. Here, the first predetermined period T1 may be a period equal to the preceding zeroth predetermined period T0 plus an input period T_stress for the stress application signal and a margin period Tm (T1=T0+T_stress+Tm). The input timing may be adjusted to be shifted among the semiconductor chips PE2 to PE7.

Therefore, in the variation according to the second embodiment, the input timing for the stress application signal is shifted among the semiconductor chips PE0 to PE7 to allow inhibition of a possible excessively large peak current resulting from a plurality of stress application signals.

Third Embodiment

[3-1] Configuration of the ZQ Calibration Circuit

Figure 24:
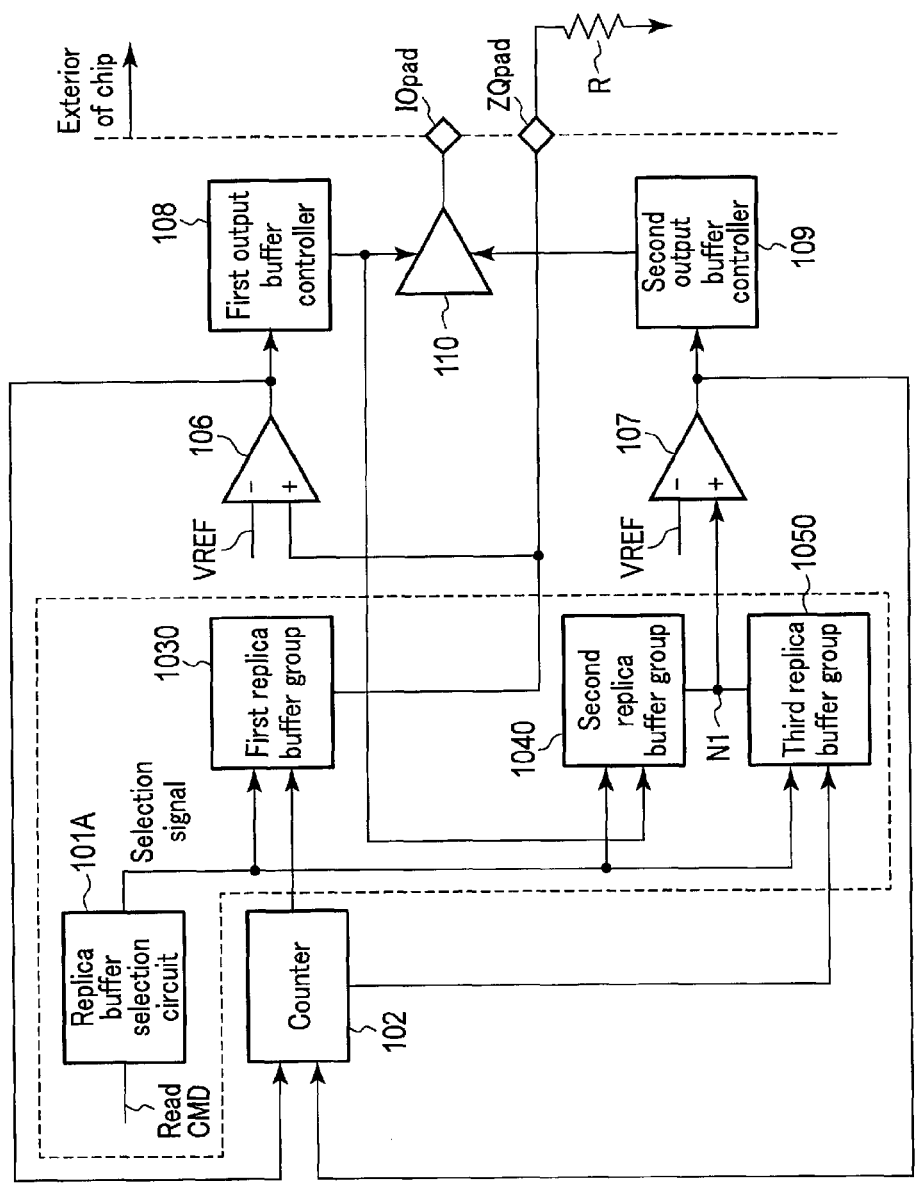
FIG. 24 is a schematic diagram depicting a ZQ calibration circuit according to a third embodiment and a peripheral configuration therefor.
Figures 25, 26:
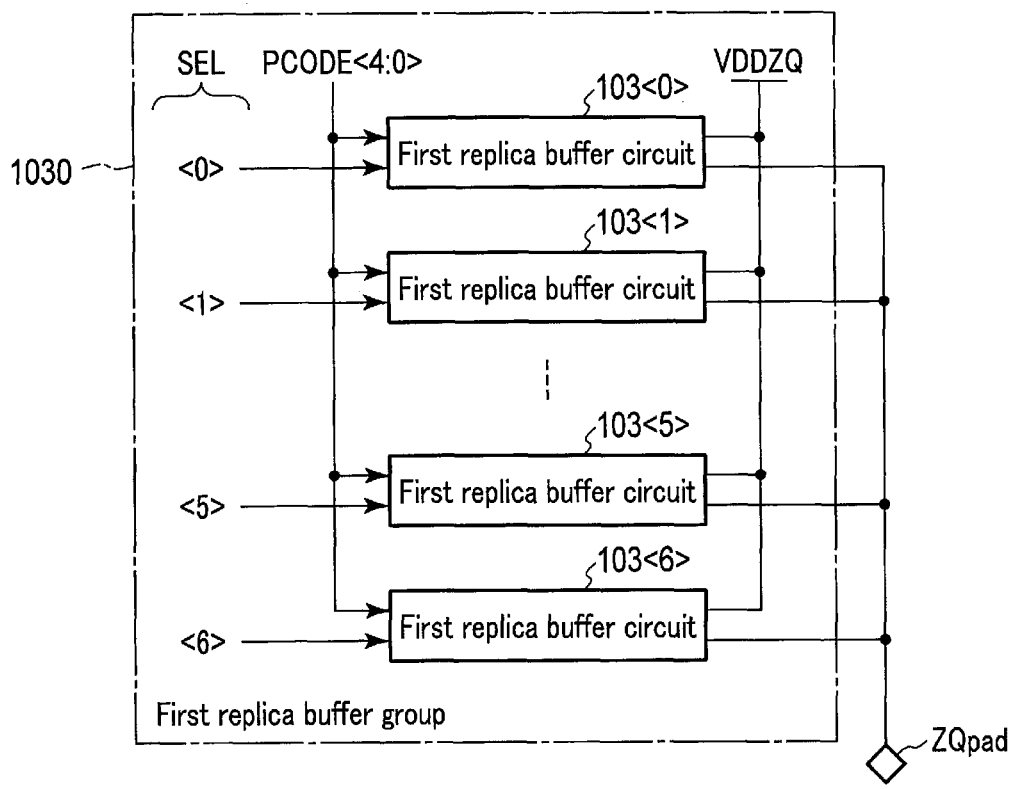
FIG. 25 is a schematic diagram illustrating information including a usage status and a selection target associated with each other according to the third embodiment.
FIG. 26 is a schematic diagram depicting a configuration of a first replica buffer group according to the third embodiment.
Figure 27:
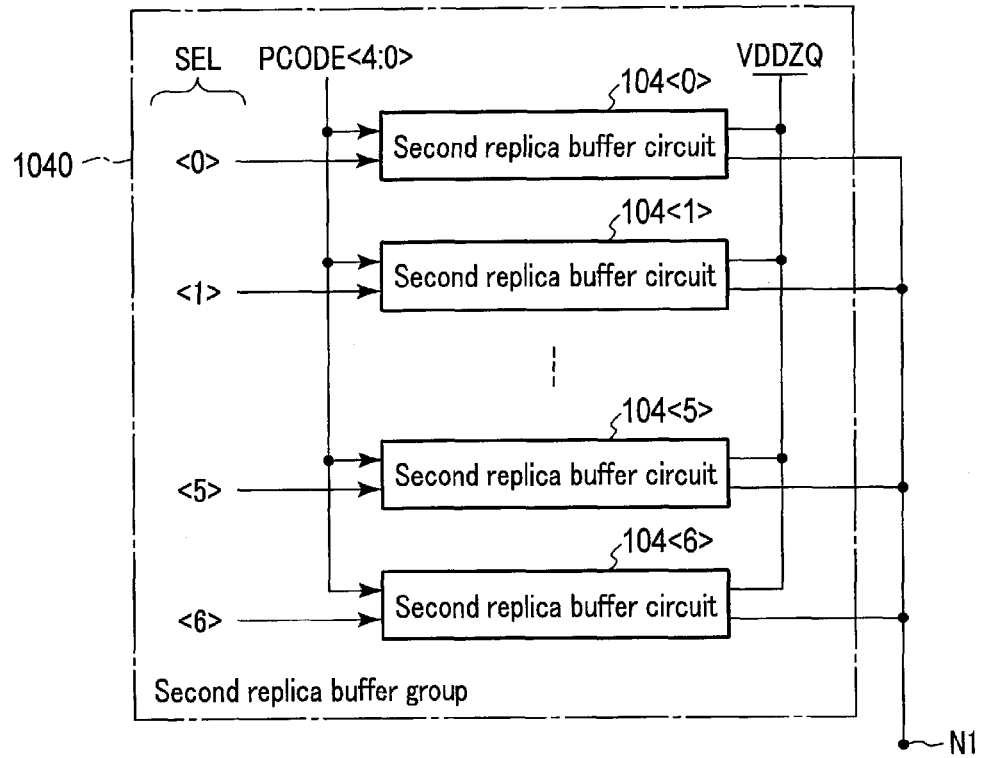
FIG. 27 is a schematic diagram depicting a configuration of a second replica buffer group according to the third embodiment.
Figure 28:
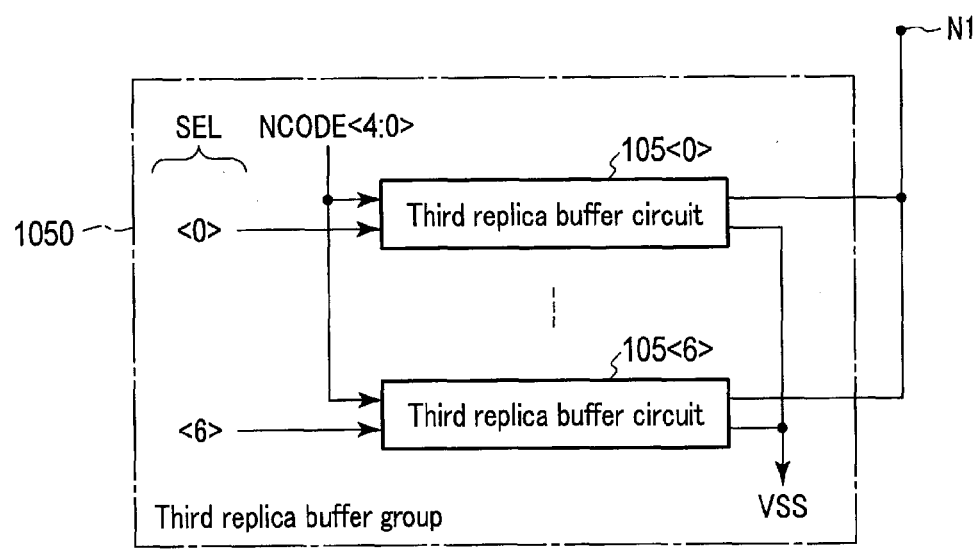
FIG. 28 is a schematic diagram depicting a configuration of a third replica buffer group according to the third embodiment.

Now, a semiconductor device according to a third embodiment will be described. FIG. 24 is a schematic diagram depicting a ZQ calibration circuit according to the third embodiment and a peripheral configuration therefor. FIG. 25 is a schematic diagram illustrating information including the usage status and a selection target associated with each other. FIGS. 26 to 28 are schematic diagrams depicting configurations of first to third replica buffer groups.

The third embodiment is a variation of the first and second embodiments which uses a modified scheme for implementing the replica buffer circuits 103 to 105 with stress applied thereto.

In the first and second embodiments, the stress application signal is input during operation to adjust the degradation of the characteristics of the replica buffer circuits 103 to 105.

In contrast, the third embodiment is provided with the plurality of replica buffer circuits with different electric stresses applied thereto. In this regard, any one of the plurality of replica buffer circuits is selected to adjust the degradation of the characteristics of the replica buffer circuits.

Specifically, the third embodiment has a replica buffer selection circuit 101A instead of the replica buffer controller 101 and comprises a first to a third replica buffer groups 1030 to 1050 instead of the first to third replica buffer circuits 103 to 105.

In this regard, the replica buffer selection circuit 101A selects any one of a plurality of replica buffer circuits 103<0> to 103<6>, 104<0> to 104<6>, 105<0> to 105<6> in the replica buffer groups 1030, 1040, 1050 as a target for the calibration operation according to the usage status for the output buffer circuit 110. Specifically, for example, the replica buffer selection circuit 101A reads, from the memory cell array, information including the usage status and the selection target associated with each other, and selects the replica buffer circuit based on the information. For the usage status, for example, the range of the number of receptions of the read command is available. In this case, for example, the replica buffer selection circuit 101A, when started, reads the number of receptions of the read command from the memory cell array. The replica buffer selection circuit 101A updates the number of receptions of the read command each time the read command is received, and at the time of power-off, saves the updated number of receptions in the memory cell array. For the selection target, for example, a selection signal name or a replica buffer circuit name is available as needed. In this example, numerical values included in selection signal names SEL<0> to SEL<6> correspond to the degree of degradation of the characteristics of the replica buffer circuits. Furthermore, when the numerical values included in the selection signal names SEL<0> to SEL<6> are the same, the replica buffer selection circuit 101A selects replica buffer circuits in the replica buffer groups 1030, 1040, 1050 which are subjected to substantially the same degree of degradation of the characteristics. For example, the selection signal name SEL<1> allows selection of the replica buffer circuits 103<0>, 104<0>, 105<0> in the replica buffer groups 1030, 1040, 1050, which have the characteristics thereof degraded to substantially the same degree.

Now, the first to third replica buffer groups 1030 to 1050 will be described with reference to FIGS. 26 to 28.

First, the first and second replica buffer groups 1030, 1040 have the same circuit configuration except for connection destinations (ZQ, N1) as depicted in FIG. 26 and FIG. 27. Thus, here, the first replica buffer groups 1030 depicted in FIG. 26 will be described by way of example.

The first replica buffer group 1030 comprises a plurality of first replica buffer circuits 103<0> to 103<6>. Each of the first replica buffer circuits 103<0> to 103<6> has the same configuration as that of the first replica buffer circuit 103 in FIG. 3 (or FIG. 5). The impedance control signal PCODE<4:0> is input to the first replica buffer circuits 103<0> to 103<6>. The transistor PT corresponding to the activated bit in the impedance control signal PCODE<4:0> is turned on. The first replica buffer circuits 103<0> to 103<6> are provided with the power supply VDDZQ and connected in parallel with the ZQ pad. The selection signals SEL<0> to SEL<6> from the replica buffer selection circuit 101A are input to the first replica buffer circuits 103<0> to 103<6>, respectively. For example, when the selection signal SEL<0> is asserted while the calibration operation is being performed on the first replica buffer circuit 103<0>, the first replica buffer circuit 103<0> selected by the selection signal SEL<0> is connected to the ZQ pad.

Similarly, the third replica buffer group 1050 comprises a plurality of third replica buffer circuits 105<0> to 105<6> as depicted in FIG. 28. Each of the third replica buffer circuits 105<0> to 105<6> has the same configuration as that of the third replica buffer circuit 105 in FIG. 7 (or FIG. 8). The impedance control signal NCODE<4:0> is input to the third replica buffer circuits 105<0> to 105<6>. The transistor NT corresponding to the activated bit in the impedance control signal NCODE<4:0> is turned on. The third replica buffer circuits 105<0> to 105<6> are connected in parallel with the node N1 and provided with the power supply VSS. The selection signals SEL<0> to SEL<6> from the replica buffer selection circuit 101A are input to the third replica buffer circuits 105<0> to 105<6>, respectively. For example, when the selection signal SEL<0> is asserted while the calibration operation is being performed on the third replica buffer circuit 105<0>, the second replica buffer circuit 104<0> and the third replica buffer circuit 105<0> selected by the selection signal SEL<0> are connected to the node N1.

[3-2] Operations

In the ZQ calibration circuit 100, the replica buffer selection circuit 101A, when started, reads the number of receptions of the read command from the memory cell array and also reads, from the memory cell array, the information including the usage status and the selection target associated with each other.

Subsequently, based on the read number of receptions and the read information, the replica buffer selection circuit 101A, for example, inputs the selection signal SEL<1> to the first to third replica buffer groups 1030 to 1050.

In the first replica buffer group 1030, the first replica buffer circuit 103<1> selected by the selection signal SEL<1> is connected to the ZQ pad. Furthermore, in the second and third replica buffer groups 1040, 1050, the second and third replica buffer circuits 104<1>, 105<1> are connected to the node N1.

Thus, in the ZQ calibration circuit 100, the degradation of the characteristics of the replica buffer circuits is adjusted. The ZQ calibration operation is performed as described above.

Furthermore, the replica buffer selection circuit 101A updates the number of receptions of the read command each time the read command is received, and at the time of power-off, saves the updated number of receptions in the memory cell array.

[3-3] Effects According to the Third Embodiment

According to the present embodiment, effects similar to the effects of the first and second embodiments can be produced without the need to input the stress application signal during operation.

[3-4] Variation According to the Third Embodiment

A variation of the ZQ calibration circuit 100 according to the third embodiment will be described. This variation is different from the above-described third embodiment in that the replica buffer circuit is selected based on a command received from the controller 2000 instead of the usage status. That is, in this variation, a user inputs a command for selection of the replica buffer circuits to the semiconductor device 1000 through the controller 2000 to allow the replica buffer selection circuit 101A to select the replica buffer circuits. In this case, the degradation of the characteristics of the replica buffer circuits 103<0> to 103<6>, 104<0> to 104<6>, 105<0> to 105<6> can be adjusted regardless of the usage status.

The first to third embodiments and the variations thereof are not limited to the above-described forms, and various modifications may be made to the embodiments and variations. For example, in the above-described embodiments, the case has been described where the semiconductor device 1000 and the controller 2000 are separate semiconductor chips. However, the semiconductor device 1000 and the controller 2000 may be formed using one chip.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A ZQ calibration circuit, comprising:
a replica buffer controller configured to apply electric stress to a replica buffer circuit with a circuit configuration substantially identical to a circuit configuration of an output buffer circuit according to a usage status of the output buffer circuit during a period when no calibration operation is performed.

2. The ZQ calibration circuit of claim 1, wherein the replica buffer controller inputs a stress application signal allowing the electric stress to be applied, to the replica buffer controller in response to a data signal or a data strobe signal output from the output buffer circuit.

3. The ZQ calibration circuit of claim 2, wherein the replica buffer controller adjusts a frequency or a duty ratio of the stress application signal.

4. The ZQ calibration circuit of claim 1, further comprising a first adjustment circuit configured to adjust a power supply voltage for the replica buffer circuit.

5. The ZQ calibration circuit of claim 1, further comprising a second adjustment circuit configured to adjust a load-carrying capacity of the replica buffer circuit.

6. The ZQ calibration circuit of claim 1, wherein the replica buffer controller inputs a stress application signal allowing the electric stress to be applied to the replica buffer circuit in response to a read command.

7. The ZQ calibration circuit of claim 6, wherein the replica buffer controller coordinates a timing to input the stress application signal with other semiconductor chips operating in parallel in an identical package.

8. A ZQ calibration circuit, comprising:
a plurality of replica buffer circuits having a circuit configuration substantially identical to a circuit configuration of an output buffer circuit and to which different electric stresses are pre-applied; and
a selection circuit configured to select one of the plurality of replica buffer circuits according to a usage status of the output buffer circuit.

9. The ZQ calibration circuit of claim 8, wherein the selection circuit reads information including the usage status and a selection target associated with each other and selects one of the plurality of replica buffer circuits based on the information.

10. A semiconductor device, comprising:
a ZQ calibration circuit, wherein
the ZQ calibration circuit comprises a replica buffer controller configured to apply electric stress to a replica buffer circuit with a circuit configuration substantially identical to a circuit configuration of an output buffer circuit according to a usage status of the output buffer circuit during a period when no calibration operation is performed.

11. The semiconductor device of claim 10, wherein the replica buffer controller inputs a stress application signal allowing the electric stress to be applied to the replica buffer controller in response to a data signal or a data strobe signal output from the output buffer circuit.

12. The semiconductor device of claim 11, wherein the replica buffer controller adjusts a frequency or a duty ratio of the stress application signal.

13. The semiconductor device of claim 10, further comprising a first adjustment circuit configured to adjust a power supply voltage for the replica buffer circuit.

14. The semiconductor device of claim 10, further comprising a second adjustment circuit configured to adjust a load-carrying capacity of the replica buffer circuit.

15. The semiconductor device of claim 10, wherein the replica buffer controller inputs a stress application signal allowing the electric stress to be applied to the replica buffer circuit in response to a read command.

16. The semiconductor device of claim 15, wherein the replica buffer controller coordinates a timing to input the stress application signal with other semiconductor chips operating in parallel in an identical package.

* * * * *